US012087572B2

(12) United States Patent
van Schravendijk et al.

(10) Patent No.: US 12,087,572 B2
(45) Date of Patent: Sep. 10, 2024

(54) ETCH STOP LAYER

(71) Applicant: Lam Research Corporation, Fremont, CA (US)

(72) Inventors: Bart J. van Schravendijk, Palo Alto, CA (US); Soumana Hamma, Tigard, OR (US); Kai-Lin Ou, Tualatin, OR (US); Ming Li, West Linn, OR (US); Malay Milan Samantaray, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 297 days.

(21) Appl. No.: 17/598,830

(22) PCT Filed: Mar. 26, 2020

(86) PCT No.: PCT/US2020/025004
§ 371 (c)(1),
(2) Date: Sep. 27, 2021

(87) PCT Pub. No.: WO2020/198502
PCT Pub. Date: Oct. 1, 2020

(65) Prior Publication Data
US 2022/0181141 A1 Jun. 9, 2022

Related U.S. Application Data

(60) Provisional application No. 62/825,632, filed on Mar. 28, 2019.

(51) Int. Cl.
*H01L 21/02* (2006.01)
*H01L 21/311* (2006.01)
(Continued)

(52) U.S. Cl.
CPC .... *H01L 21/0217* (2013.01); *H01L 21/02164* (2013.01); *H01L 21/02211* (2013.01);
(Continued)

(58) Field of Classification Search
CPC ........ H10B 41/20; H10B 41/41; H10B 41/27; H10B 43/20; H10B 43/35; H10B 43/27;
(Continued)

(56) References Cited

U.S. PATENT DOCUMENTS 9,214,333 B1 12/2015 Sims et al.
10,319,565 B2 * 6/2019 Bruneau ........... H01J 37/32422
(Continued)

FOREIGN PATENT DOCUMENTS

CN 103119695 A 5/2013
CN 105789027 A 7/2016
(Continued)

OTHER PUBLICATIONS

International Search Report and Written Opinion issued in PCT Application No. PCT/US2020/025004.
(Continued)

*Primary Examiner* — Nikolay K Yushin
(74) *Attorney, Agent, or Firm* — Weaver Austin Villeneuve & Sampson LLP

(57) ABSTRACT

Disclosed are methods for the formation of silicon nitride (SiN) on only the horizontal surfaces of structures such as 3D NAND staircase. This allows for thicker landing pads for subsequently formed vias. In some embodiments, the methods involve deposition of a SiN layer over a staircase followed by a treatment to selectively densify the SiN layer on the horizontal surfaces with respect to the sidewall surfaces. A wet etch is then performed to remove SiN from the sidewall surfaces. The selective treatment results in
(Continued)

significantly different wet etch rates (WERs) between the horizontal surfaces and the sidewalls.

20 Claims, 19 Drawing Sheets

(51) Int. Cl.
   *H01L 27/088* (2006.01)
   *H01L 27/1157* (2017.01)
   *H10B 43/20* (2023.01)
   *H10B 43/35* (2023.01)
(52) U.S. Cl.
   CPC .... *H01L 21/02274* (2013.01); *H01L 21/0234* (2013.01); *H01L 21/31111* (2013.01); *H01L 27/088* (2013.01); *H10B 43/20* (2023.02); *H10B 43/35* (2023.02)
(58) Field of Classification Search
   CPC ....... H10B 43/50; C23C 16/345; C23C 16/34; C23C 16/505; H01L 21/0217; H01L 21/02; H01L 21/02164; H01L 21/02211; H01L 21/02274; H01L 21/0234; H01L 21/31111; H01L 21/311; H01L 21/022; H01L 21/31144; H01L 27/1157; H01L 27/0234; H01L 27/11578; H01L 27/088; H01L 27/1203; H01L 27/0886; H01L 27/0924
   See application file for complete search history.

(56) References Cited

U.S. PATENT DOCUMENTS

| | | | |
|---|---|---|---|
| 10,644,025 B2* | 5/2020 | Chun | H01L 21/31144 |
| 10,734,244 B2* | 8/2020 | Kim | H01L 21/02274 |
| 10,763,108 B2 | 9/2020 | Hausmann et al. | |
| 11,390,635 B2* | 7/2022 | Kim | C23C 16/45553 |
| 2010/0173494 A1 | 7/2010 | Kobrin | |
| 2011/0207323 A1 | 8/2011 | Ditizio | |
| 2012/0077349 A1 | 3/2012 | Li et al. | |
| 2014/0106574 A1 | 4/2014 | Kang et al. | |
| 2016/0148949 A1 | 5/2016 | Jayanti et al. | |
| 2016/0329238 A1 | 11/2016 | Tang et al. | |
| 2017/0062204 A1 | 3/2017 | Suzuki et al. | |
| 2017/0062469 A1 | 3/2017 | Tsiang et al. | |
| 2017/0084428 A1* | 3/2017 | Bruneau | H01J 37/32128 |
| 2017/0221718 A1 | 8/2017 | Tapily | |
| 2017/0250068 A1 | 8/2017 | Ishikawa et al. | |
| 2017/0263437 A1 | 9/2017 | Li et al. | |
| 2017/0316940 A1 | 11/2017 | Ishikawa et al. | |
| 2018/0130701 A1 | 5/2018 | Chun et al. | |
| 2018/0323057 A1 | 11/2018 | Kumar et al. | |
| 2019/0035810 A1 | 1/2019 | Chun et al. | |
| 2019/0057858 A1 | 2/2019 | Hausmann et al. | |
| 2019/0148398 A1* | 5/2019 | Kim | H01L 21/0234 438/710 |
| 2020/0361966 A1* | 11/2020 | Kim | C07F 7/10 |

FOREIGN PATENT DOCUMENTS

| | | | |
|---|---|---|---|
| JP | 2006032695 | | 2/2006 |
| JP | 2012079762 | A | 4/2012 |
| JP | 2016066794 | A | 4/2016 |
| JP | 2018190986 | A | 11/2018 |
| KR | 1020140069326 | | 6/2014 |
| KR | 20170092478 | A | 8/2017 |
| TW | 201443271 | A | 11/2014 |
| WO | WO-2019028136 | A1 | 2/2019 |

OTHER PUBLICATIONS

Office Action dated Mar. 6, 2019, issued in U.S. Appl. No. 15/681,268.
Final Office Action dated Sep. 16, 2019, issued in U.S. Appl. No. 15/681,268.
Notice of Allowance dated Jan. 14, 2020, issued in U.S. Appl. No. 15/681,268.
Notice of Allowance dated Apr. 29, 2020, issued in U.S. Appl. No. 15/681,268.
International Search Report and Written Opinion issued in PCT Application No. PCT/US2018/000331.
Denser—definition of denser by the Free Dictionary via https:thefreedictionary.com/dense, 2003, pp. 1-5.
Wikipedia "Density" via https://en.wikipedia.org/wiki/Denisty, 2019 pp. 1-11.
Chemicool Dictionary, Definition of Step Coverage via http://www/cje.ocpp:/cp.defomotop/step_coverage.html, 2017, 1 page.
CN Office Action dated May 20, 2022, in Application No. CN201880067801.6 with English translation.
CN Office Action dated Nov. 18, 2021, in CN Application No. CN201880067801.6 with English translation.
International Preliminary Report on Patentability dated Feb. 27, 2020 issued in PCT Application No. PCT/US2018/000331.
JP Office Action dated Mar. 5, 2024 in JP Application No. 2021-557622, with English Translation.
KR Office Action dated Sep. 13, 2023, in Application No. KR10-2020-7007849 with English translation.
Singapore Written Opinion dated Mar. 29, 2023 issued in SG 11202110691VA.
TW Office Action dated Aug. 9, 2023, in application No. TW109110451 with English translation.
TW Office Action dated Jun. 14, 2024 in TW Application No. 109110451 with English translation.

* cited by examiner

ETCH STOP LAYER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor device fabrication involves fabrication of flash memory. As devices shrink, structures for fabricating efficient and multiple memory cells are used to maximize density of memory cells in a memory device. 3D NAND technology addresses challenges associated with two-dimensional NAND technology by stacking memory cells vertically in layers.

The background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

One aspect of the disclosure relates to a method including providing a substrate having alternating oxide layers and nitride layers arranged in a staircase pattern including exposed horizontal nitride surfaces and exposed oxide and nitride sidewall surfaces; depositing a silicon nitride (SiN) layer over the alternating oxide and nitride layers; and treating the SiN layer to selectively densify the SiN layer deposited on the exposed horizontal nitride surfaces.

In some embodiments, the method further includes wet etching the treated SiN layer to form discrete SiN pads. In some embodiments, a discrete SiN pad is at least 10 nm from the near sidewall surface. In some embodiments, a discrete SiN pad is at least 10 nm thick. In some embodiments, the method further includes replacing the SiN pads with tungsten landing pads. In some embodiments, the deposition and treating operations are performed in the same chamber.

In some embodiments, depositing the SiN layer includes a plasma enhanced chemical vapor deposition (PECVD) process.

In some embodiments, treating the SiN layer includes exposing the substrate to a capacitively-coupled plasma. It may be generated from an inert gas.

In some embodiments, performing the depositing and treating operations includes performing multiple cycles of depositing a portion of the conformal SiN layer followed by treating the deposited portion.

In some embodiments, the conformal SiN layer includes multiple sub-layers, wherein at least two sub-layers have different wet etch rates (WERs). In some such embodiments, one of the multiple sub-layers is an etch stop (ES) sub-layer having a lower WER than the other sub-layer or sub-layers of the multiple sub-layers. In some embodiments, the ES layer has a WER of no more than 50 Å/min in a wet etchant. In some embodiments, one of the multiple sub-layers is a sub-layer having a WER of at least 100 Å/min in a wet etchant. In some embodiments, the ES sub-layer is disposed between two sub-layers each being thicker than the ES sub-layer and having a WER greater than the ES sub-layer. In some embodiments, the ES sub-layer is the top layer of the SiN layer. In some embodiments, the SiN film is deposited from silane ($SiH_4$) and ammonia ($NH_3$). In some embodiments, the $SiH_4$ and $NH_3$ are in a process gas that further includes nitrogen ($N_2$). In some embodiments, the method further includes replacing the nitride layers with tungsten wordlines.

Another aspect of the disclosure relates to method including providing a substrate having horizontal and sidewall surfaces; depositing a silicon nitride (SiN) layer over the horizontal and sidewall surfaces; and treating the SiN layer to selectively densify the conformal SiN layer deposited on the horizontal surfaces. In some embodiments, the method further includes wet etching the treated layer to form discrete SiN pads.

Yet another aspect of the disclosure relates to a method including providing a substrate having horizontal and sidewall surfaces; performing one or more first cycles to form a first sub-layer, each of the one or more first cycles including depositing an amount of SiN on the horizontal and sidewall surfaces by PECVD and exposing the deposited amount of SiN to a capacitively coupled plasma generated from an inert gas; performing one or more second cycles to form an etch stop sub-layer, each of the one or more second cycles including: depositing an amount of SiN on the first sub-layer by PECVD and exposing the deposited amount of SiN to an capacitively coupled plasma generated from an inert gas using low frequency radio frequency (LFRF) power. In some embodiments, the LFRF power in the one or more second cycles is greater than the LFRF power, if any, in the one or more first cycles.

Another aspect of the disclosure relates to an apparatus including a PECVD deposition chamber including a LFRF plasma generator and a HFRF plasma generator; and a controller including instructions to perform any of the methods disclosed herein.

These and other aspects of the disclosure are discussed in the description below with reference to the drawings.

DETAILED DESCRIPTION

Figure 1A:
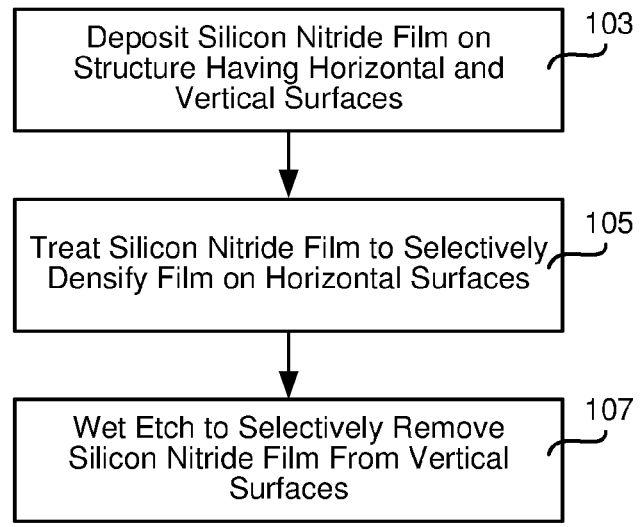
FIG. 1A is a process flow diagram depicting operations for a method according to certain embodiments.

In the following description, numerous specific details are set forth to provide an understanding of the presented embodiments. The disclosed embodiments may be practiced without some or all of these specific details. In other instances, well-known process operations have not been described in detail to not obscure the disclosed embodiments. Further, while the disclosed embodiments will be described in conjunction with specific embodiments, it will be understood that the specific embodiments are not intended to limit the disclosed embodiments.

The implementations disclosed below describe deposition of a material on a substrate such as a wafer, substrate, or other work piece. The work piece may be of various shapes, sizes, and materials. In this application, the terms "wafer" and "substrate," are used interchangeably.

Semiconductor fabrication often involves fabrication of memory devices. One example is fabrication of a 3D NAND, also referred to as a "vertical NAND" (VNAND), structure. However, existing techniques for forming 3D NAND structures are limited to vertical scaling: the number of memory layers are increased. To obtain the desired cost scaling per bit, it is critical to not increase the number of process steps in proportion to the layer increase.

In 3D NAND technology, an oxide filler is deposited over alternating oxide and nitride layers that are arranged in a staircase pattern. The nitride layers are then replaced by a metal film, typically comprising tungsten to form the wordlines. Vias are then formed in the oxide filler. The vias extend vertically to contact the tungsten wordlines, which now form the treads of the staircase. Metal, such as tungsten, is deposited in the vias to form interconnects which extend to and contact the tungsten wordlines. As 3D NAND scales the staircase has more treads and becomes deeper. In addition, to reduce the overall height of the memory stack, it is desirable to thin the wordlines. The wordlines that form the staircase treads also fulfill the function of etch stop for the via etch. For cost reasons it is desirable to form the vias in one masking and etch step. However, as the staircase gets deeper and the wordlines get thinner, as demanded by scaling, it becomes increasingly difficult to have the upper wordlines survive the long overetch needed to reach the bottom wordlines. Thus, contact surfaces on wordlines located at higher positions on the staircase may be over-etched relative to wordlines located toward the bottom of the staircase pattern. As a result, the etch may punch through those wordlines to reach another wordline below. When the via is then filled with metal these wordlines will be shorted, causing yield loss.

Disclosed are methods and related apparatuses that provide for the formation of silicon nitride (SiN) on only the horizontal surfaces of a 3D NAND staircase. This allows for thicker landing pads for subsequently formed vias. In some embodiments, the methods involve deposition of a SiN layer over a staircase followed by a treatment to selectively densify the SiN layer on the horizontal surfaces with respect to the sidewall surfaces. A wet etch is then performed to remove SiN from the sidewall surfaces. The selective treatment results in significantly different wet etch rates (WERs) between the horizontal surfaces and the sidewalls. After the wet etch, the SiN layer remains on the horizontal surfaces and is removed from the sidewalls. When the SiN layer is replaced by tungsten (W) in subsequent processing, a thick W pad is formed. While the methods and tools below are described in the context of forming SiN pads on nitride layers in a 3D NAND structure, they may be employed in any application where selective SiN deposition on horizontal surfaces is sought.

In addition to SiN, the methods described below may be applied to form silicon oxynitride (SiON) films. Further, the pads may be formed from any applicable oxide, nitride, carbide, oxynitride, oxynitridecarbide, or oxycarbide film.

FIG. 1A shows a process flow diagram of operations performed in accordance with the methods described herein. First, in operation 103, a layer of SiN is deposited over a structure having horizontal and vertical surfaces (also referred to as sidewall surfaces). According to various embodiments, operation 103 can involve plasma enhanced chemical vapor deposition (PECVD), plasma enhanced atomic layer deposition (PEALD), or thermal atomic layer deposition (ALD). Other deposition techniques that are capable of conformal deposition may be used. For deposition on a staircase structure, the total thickness deposited can depend on one or more of the following targets: 1) a remaining SiN thickness on the horizontal surfaces after wet etch (which determines tungsten landing pad thickness), 2) the minimum distance of SiN from the sidewalls of the staircase structure, and 3) lack of over-etch to achieve (1) and (2). According to various embodiments, the thickness may be between 300 Å-900 Å.

The SiN film deposits on both the horizontal and vertical surfaces of the structure. It is generally conformal to the structure, though depending on the deposition method, there may be some variation in thickness on the sidewall vs horizontal surface thicknesses. It should be noted that the term "vertical" as used herein includes near 90° from planar as well as perfectly vertical surfaces. For example, a vertical surface may be +/−10° or +/−5° or +/−1° or +/−0.5 from 90°. Similarly, horizontal surfaces may vary +/−5° or +/−1° or +/−0.5 from 180°.

PECVD can be used to provide relatively fast deposition. In some embodiments, silane ($SiH_4$) and ammonia ($NH_3$) may be reacted in a PECVD deposition to form SiN. Nitrogen ($N_2$) or an inert gas such as argon (Ar) or helium (He) may be used as a carrier gas. Other silicon-containing precursors may be used to deposit SiN including but not limited to organosilanes. Similarly, other nitrogen containing gases such as $N_2$ may be used as co-reactants as appropriate.

At an operation 105, the silicon nitride film is treated to selectively densify the horizontal surfaces. In this context, selectively densify refers to densifying the SiN film on the horizontal surfaces while the SiN film on the vertical surfaces is not densified or is densified to a significantly lesser extent. Operation 105 can involve exposing the deposited film to an inert gas plasma. For PECVD reactions or PEALD reactions, this may be performed in the deposition chamber. In some embodiments, a bias voltage may be applied to the substrate to increase the directionality of the plasma, however, the method may be performed without a bias. A capacitively-coupled in-situ Ar plasma with no substrate bias for example has been demonstrated to selectively densify film on horizontal surfaces.

It should be noted that operations 103 and 105 may be performed in multiple interspersed stages. That is, a first amount of a silicon nitride may be deposited then treated, a second amount of a silicon nitride film may be deposited then treated, etc. until the full thickness of SiN film is formed. This may be useful if the treatment has a limited penetration depth to ensure that the full thickness of film is treated.

A wet etch is then performed to selectively remove the SiN film from the vertical surfaces in an operation 107. Dilute hydrofluoric acid (DHF) may be used, though other wet etchants such as phosphoric acid may be used. As described further below, in some implementations, the SiN layer may have multiple sub-layers having different WERs.

Figure 1B:
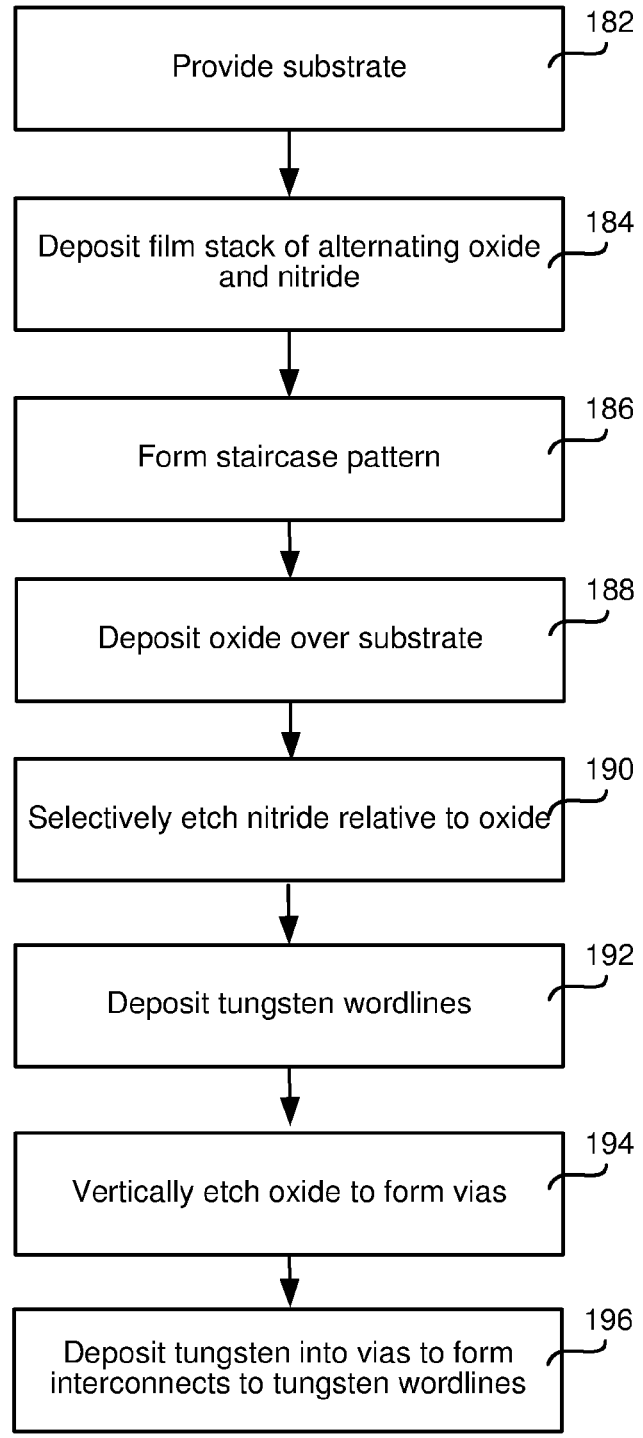
FIG. 1B is a process flow diagram depicting operations for a method of forming a 3-D NAND structure.
Figure 2:
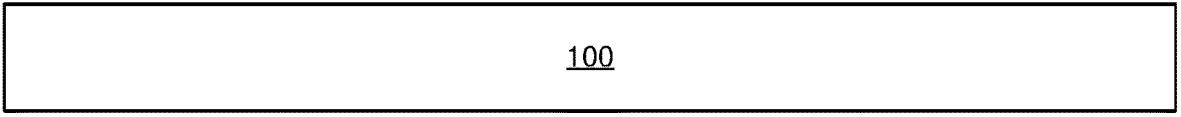
FIGS. 2, 3, and 4A are schematic illustrations of a substrate in a patterning scheme.

The method of FIG. 1A may be performed as part of a method of forming a 3D NAND structure. FIG. 1B shows a process flow diagram of operations performed in accordance with a method for forming a 3D NAND structure. In operation 182, a substrate is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. An example substrate 100 is provided as a schematic illustration in FIG. 2.

It should be noted that while the description below refers chiefly to 3D NAND structures having tungsten wordlines and vias, other metals may be used. For example, molybdenum (Mo) may be deposited to form wordlines and vias.

Returning to FIG. 1B, in operation 184, a film stack of alternating oxide and nitride films is deposited on the substrate. In various embodiments, the oxide layer deposited is a silicon oxide layer. In various embodiments, the nitride layer deposited is a silicon nitride layer.

Each oxide and nitride layer may be deposited to about the same thickness, such as between about 10 nm and about 100 nm, for example about 25 nm to 35 nm in some embodiments. The oxide layers may be deposited at a deposition temperature of between about room temperature and about 700° C. It will be understood that "deposition temperature" (or "substrate temperature") as used herein refers to the temperature that the pedestal holding the substrate is set to during deposition.

Oxide and nitride layers for forming the alternating oxide and nitride film stack may be deposited using any suitable technique, such as ALD, PEALD, chemical vapor deposition (CVD), PECVD, or sputtering. In various embodiments, the oxide and nitride layers are deposited by PECVD.

The film stack may include, for example, between 48 and 512 layers of alternating oxide and nitride layers with more alternating layers possible. Each oxide or nitride layer constitutes one layer. The film stack including the alternating oxide and nitride layers may be referred to as an oxide-nitride-oxide-nitride (ONON) stack.

Figure 3:
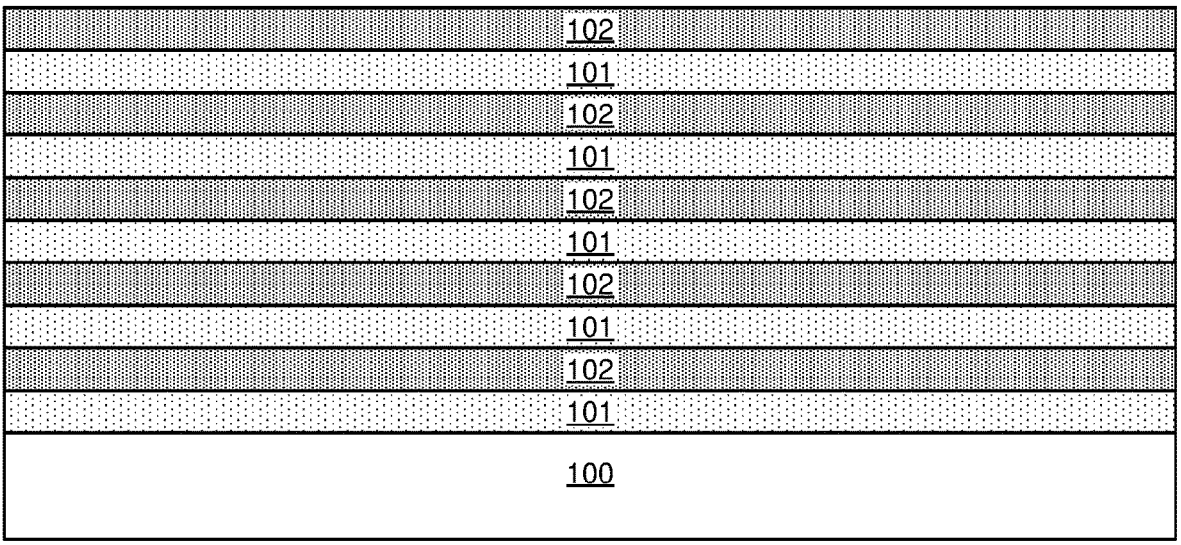

FIG. 3 shows an example schematic illustration of a substrate 100 with alternating oxide 101 and nitride 102 films deposited on the substrate 100. Note that while the structure shown in FIG. 3 shows an oxide deposited first, followed by nitride, oxide, nitride, etc., nitride may be deposited first, followed by oxide, nitride, oxide, etc.

Following deposition of the ONON stack, referring to FIG. 1B, in operation 186, a staircase pattern is formed on the substrate. A "staircase pattern" as referred to herein describes two or more steps, each step including an oxide layer and a nitride layer. It will be understood that the top layer of each set of oxide and nitride layers may be either an oxide layer or a nitride layer for formation of steps in a staircase. In various embodiments, the staircase pattern includes between 24 and 256 steps. The staircase pattern may be formed using a variety of patterning techniques. One technique includes depositing a sacrificial layer over the substrate and masking regions of the substrate to etch each set of oxide and nitride layers to form the staircase. Another technique include patterning photoresist, etching, trimming the resist, then repeating the etch and trim operations until the resist is too thin at which point it is reapplied.

Figure 4A:
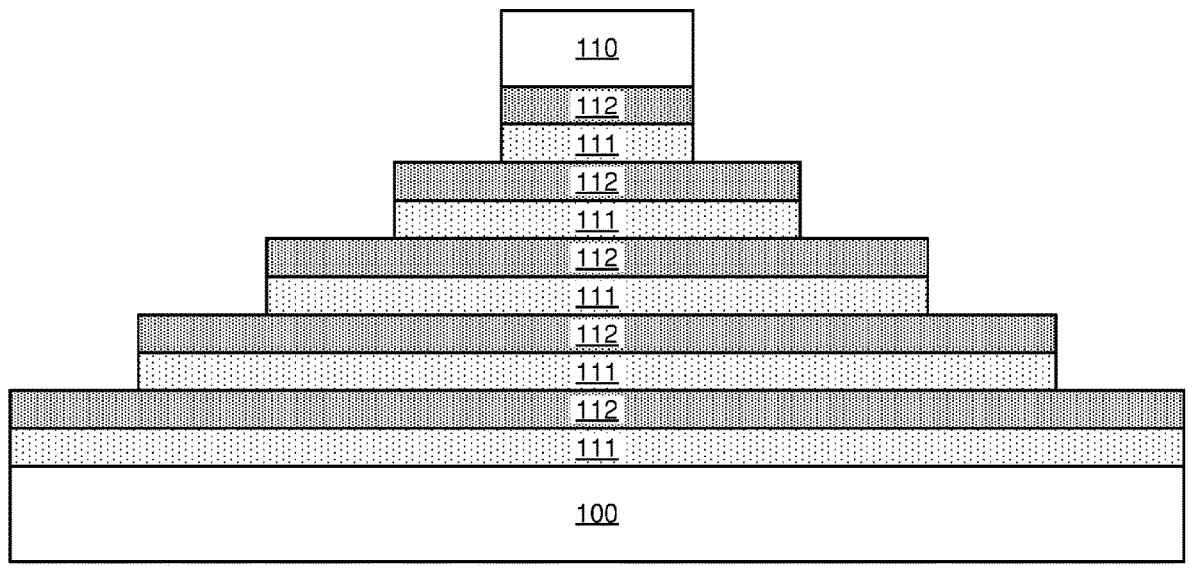

FIG. 4A provides an example of a substrate 100 including a staircase pattern of oxide layers 111 and nitride layers 112 with a hardmask 110 over the topmost nitride layer. Although FIG. 4A shows four steps of a staircase pattern, it will be understood that a staircase pattern may have any number of steps, such as between 24 and 256 steps. Each step includes a nitride layer and an oxide layer. The region of each step extending out from the edge of the step above it may be referred to as an "exposed" region of the step or topmost layer of the step, or portion suitable for deposition thereon. As shown, the exposed region is nitride.

Figure 4B:
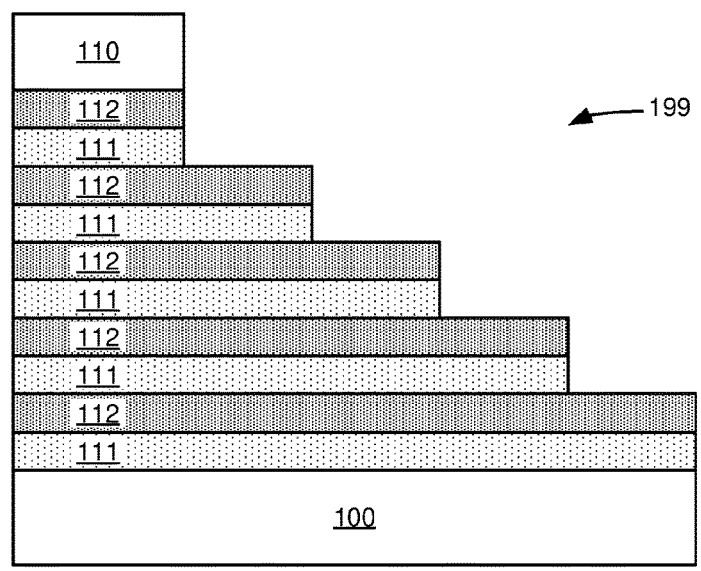
FIG. 4B is a partial view of the substrate shown in FIG. 4A.

A view 199 of the staircase pattern shown in FIG. 4A bisected across, for example, a width-wide direction of the staircase, is shown in FIG. 4B to highlight the tiered structure of the staircase pattern. Oxide layers 111 are positioned parallel to, and in between, nitride layers 112. Each set of one oxide layer 111 followed by one nitride layer 112 is longer than the set immediately above it, thus forming the staircase pattern with exposed regions.

In some embodiments, in operation 188 of FIG. 1B, oxide is deposited over the substrate. The oxide may be of the same or of different composition as the oxide deposited in layers of the ONON stack. In various embodiments, the oxide deposited over the substrate is deposited at the same or a different deposition temperature than the deposition temperature used for depositing the oxide layers in the ONON stack. The deposition temperature may be between room temperature and about 600° C. Vertical slits may be subsequently etched into the substrate after depositing and planarizing the oxide.

Figure 5A:
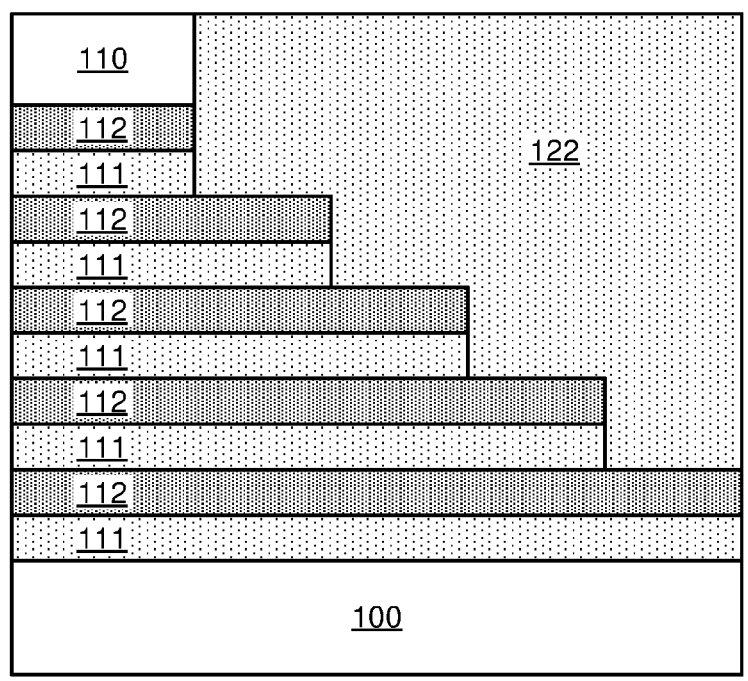
FIGS. 5A, 6A, 7A, 8, and 9 are schematic illustrations of a substrate in a patterning scheme.
Figure 5B:
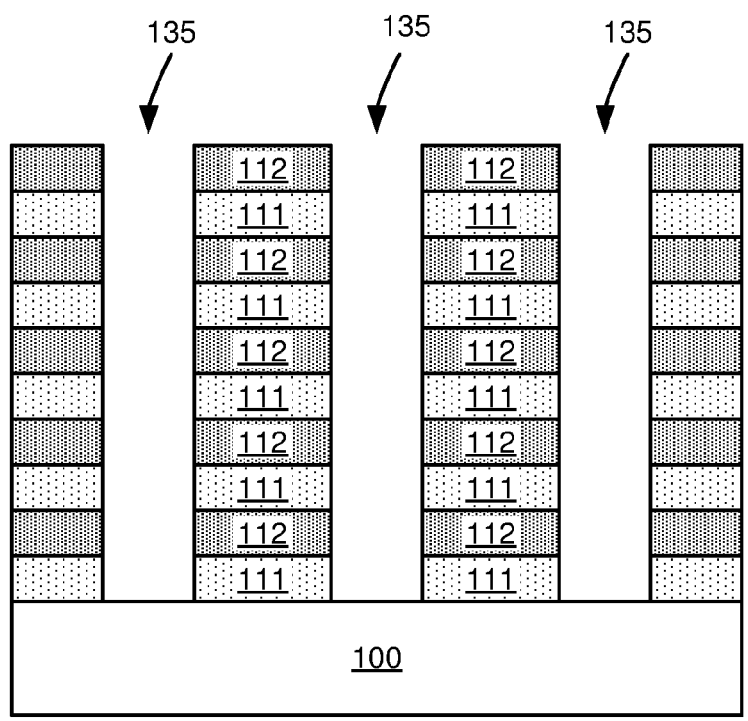
FIGS. 5B, 6B, and 7B are side views of schematic illustrations of substrates depicted in FIGS. 5A, 6A, and 7A, respectively.

FIG. 5A shows an example substrate 100 including the ONON staircase, hardmask 110, and oxide 122 deposited over the substrate. FIG. 5B shows a side view of the substrate 100 after vertical slits 135 are etched and the hardmask 110 is removed.

In operation 190, nitride is selectively etched relative to oxide on the substrate. Etching may be performed using a selective dry etch process, such as by exposing the substrate to any one or more of the following gases: chlorine ($Cl_2$), oxygen ($O_2$), nitrous oxide ($N_2O$), tetrafluoromethane ($CF_4$), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). The operation 190 removes the nitride layers from the ONON stack such that etch species flow into vertical slits formed in the staircase pattern and selectively etches nitride. It will be understood that the selective etching involves etching a first material at a rate faster than etching a second material. For example, selectively etching nitride relative to oxide means nitride is etched at a faster rate than etching of oxide. Nitride can also be selectively etched using a wet etch process, such as by exposing the substrate to phosphoric acid ($H_3PO_4$), diluted hydrofluoric acid ("DHF") or a mixture of these solutions. However, selectively removing nitride poses a risk for degradation and removal of oxide material at various interfaces, such as at the oxide-oxide interface at the end of each staircase. This is described further below with respect to FIG. 6A.

Figure 6A:
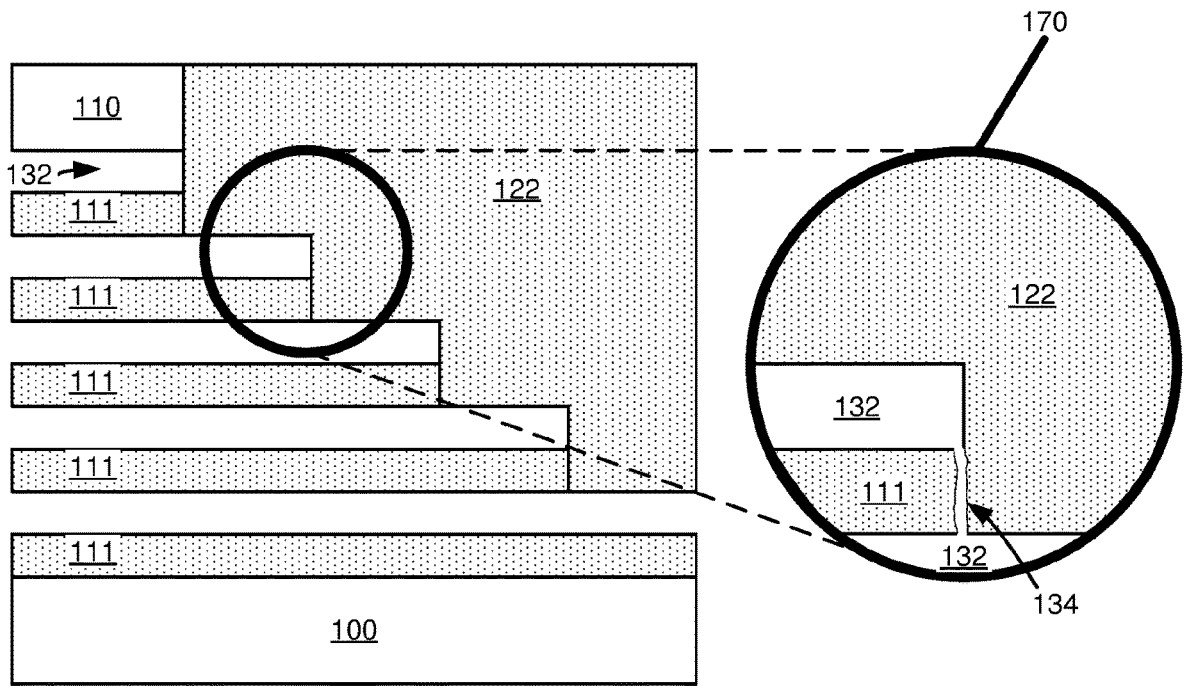
Figure 6B:
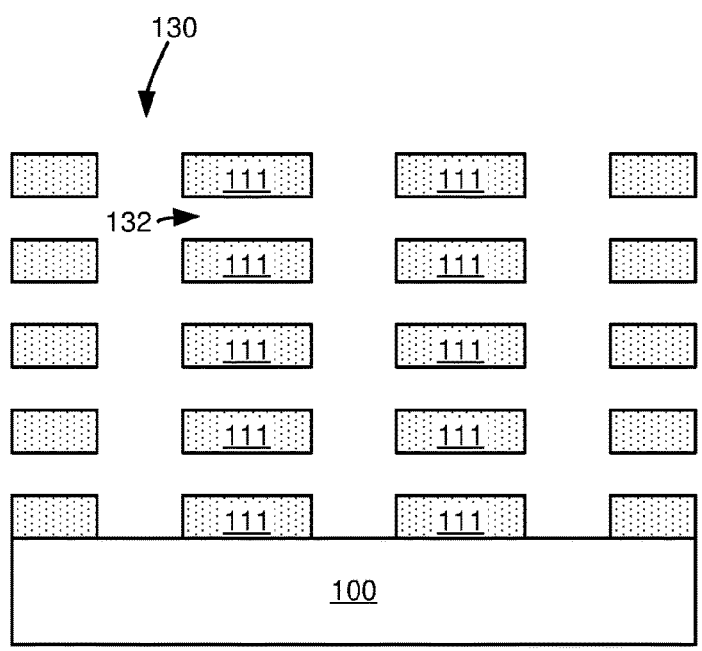

FIG. 6A shows an example schematic illustration of a substrate 100 with horizontal gaps 132 formed from etching the nitride layers 112. As shown in the enlarged view depicted in the circle at 170, a gap 134 may form at the oxide-oxide interface due to the etching species flowing into the gaps 132 and etching away at the oxide during the etching operation. FIG. 6B shows a side view of a cross-section of the substrate whereby gaps 132 are formed from selectively etching nitride.

Returning to FIG. 1B, in operation 192, tungsten is deposited into the gaps of the substrate to form tungsten wordlines. Tungsten may be deposited by any suitable technique, such as ALD, CVD, PEALD, and PECVD. Prior to depositing bulk tungsten, one or more additional layers may be deposited. For example, an alumina ($Al_2O_3$) layer may be deposited as a blocking oxide, followed by a titanium nitride (TiN) barrier layer, and a tungsten nucleation layer.

Figure 7A:
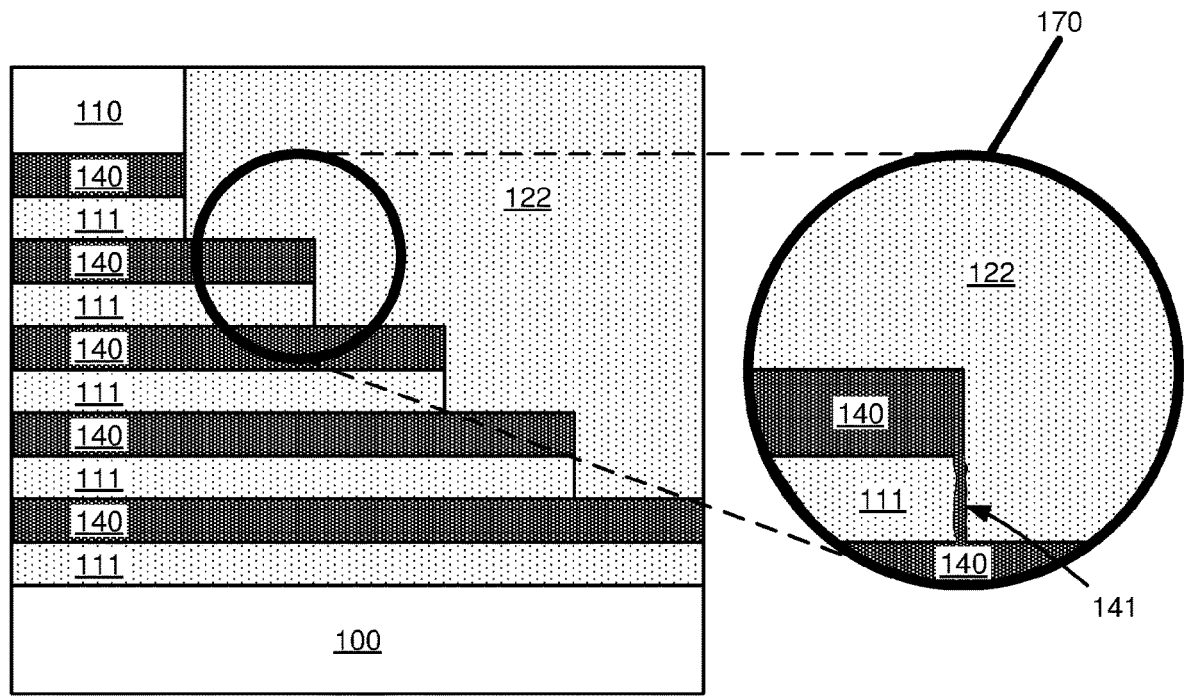
Figure 7B:
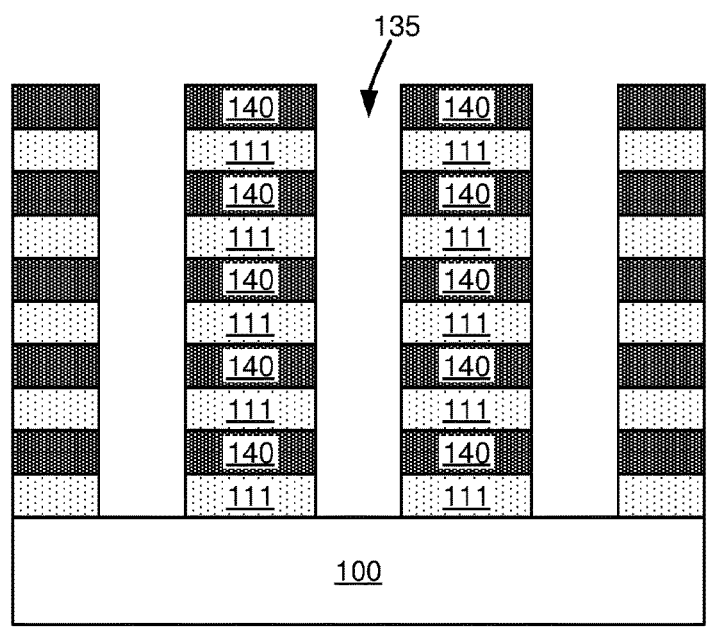

FIG. 7A shows an example of a substrate 100 including deposited tungsten wordlines 140. However, due to the degradation of the oxide at the oxide-oxide interface as shown in the zoomed-in view at 170, tungsten fills in the gap at 141, thereby connecting two wordlines 140, which can cause a short. FIG. 7B shows a schematic illustration of the substrate in 7A at a cross-section from a side view with tungsten 140 deposited in the gaps where nitride was located previously.

Figure 8:
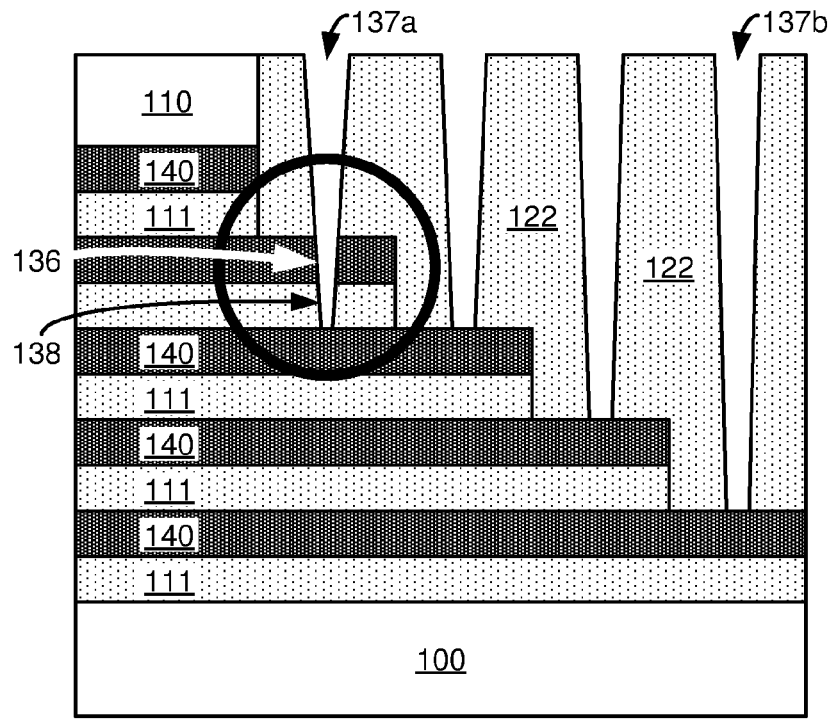

Returning to FIG. 1B, in operation 194, the oxide is vertically etched to form vias. The oxide may be etched by dry etching using exposure to an etchant such as one or more of the following gases: $O_2$, Ar, $C_4F_6$, $C_4F_8$, $SF_6$, $CHF_3$, and $CF_4$. FIG. 8 shows an example substrate 100 including the ONON stack in a staircase pattern whereby vias 137 are etched in the oxide 122. However, due to the relative thinness of the tungsten wordline layer, and the lengthy duration of etching used to ensure sufficient vertical etching to etch the deepest vias (e.g., 137b), etching species flows into the vias (e.g., 137a) that are etched for the shallow parts of the oxide, to thus etch through the tungsten layer 136 and even etching through another oxide layer 138. As discussed earlier, such a phenomenon is typically undesirable and referred to as "punchthrough," or "breakthrough," to the layers positioned beneath the intended tungsten wordline contact point or layer.

Figure 9:
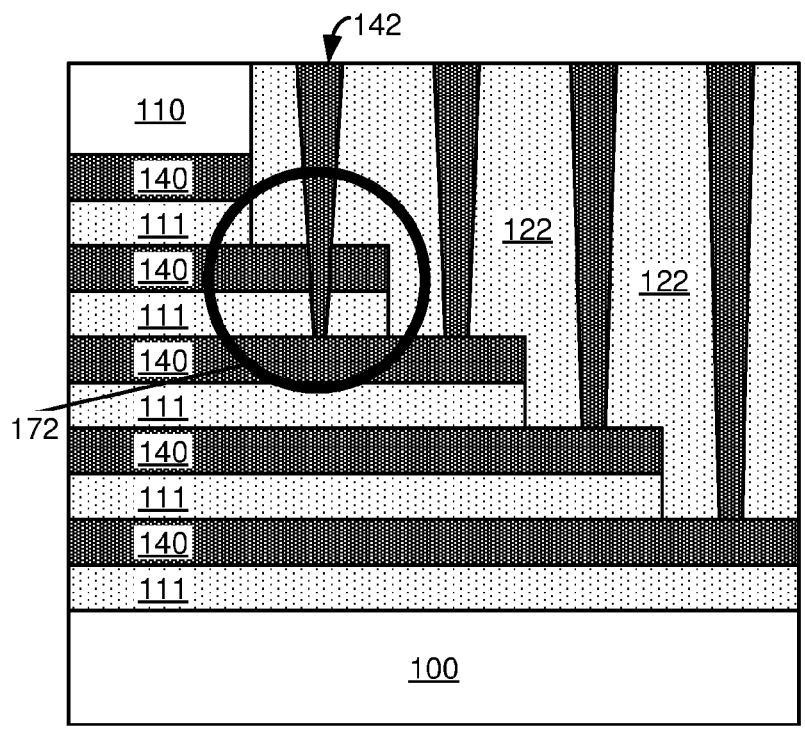

In FIG. 1B, in operation 196, tungsten is deposited in the vias to form interconnects to the tungsten wordlines However, as shown in FIG. 9, since the shallow vias caused breakthrough to the layers below due to the duration used to etch the deep vias, tungsten fills the vias (see filled tungsten via 142) and causes a short as circled in 172 of FIG. 9. Vias vary in depth and may have a depth between about 1 micron and about 14 microns, or more. Shallow vias are at the top and may have a depth of less than 100 nm. Deep vias may have a depth greater than 3.0 microns. The critical dimension of vias formed in the oxide may be between about 50 nm and about 500 nm. Vias may be etched using a dry etch process which may involve masking operations to pattern the oxide.

Challenges in forming 3D NAND structures include punchthrough of tungsten wordlines when etching vias of different depths. Extensive etching techniques that use a variety of chemistries and patterning processes to mask regions of the substrate to etch vias of different depths can reduce throughput and reduce efficiency of fabrication processes.

Provided herein are methods and apparatuses for forming 3D NAND that addresses these challenges. The methods involve depositing SiN on exposed horizontal portions of nitride layers of the staircase pattern to form SiN pads. Material deposited on exposed nitride and oxide sidewall surfaces etched by a wet etch process. The nitride layers of the staircase pattern, along with the SiN pads formed on each nitride layer, are etched selective to the oxide layers to form horizontal gaps and vacant regions corresponding to the locations of the SiN pads. Tungsten fills the horizontal gaps and vacant regions to form tungsten wordlines and landing pads on the wordlines. Each of the landing pads has a sufficient thickness to function as an etch stop layer or a protective barrier to prevent an interconnect from punching through the tungsten wordline.

Figure 10:
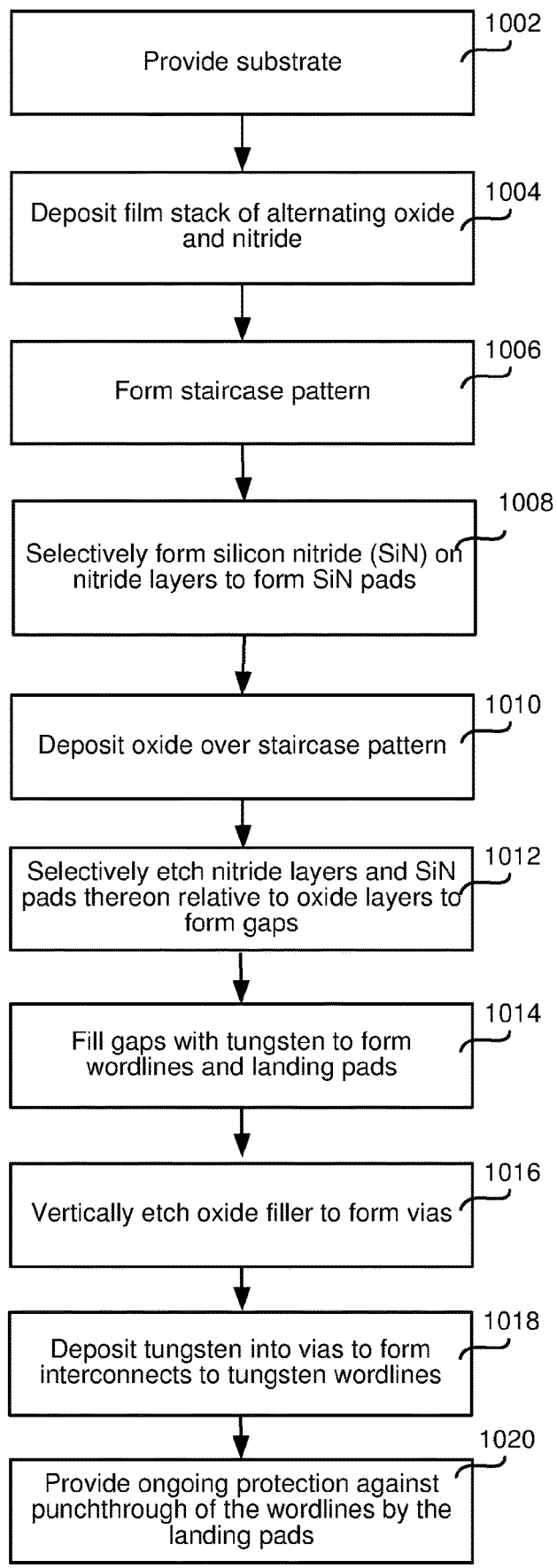
FIG. 10 is a process flow diagram depicting operations for a method in accordance with certain embodiments.

FIG. 10 is a process flow diagram of operations for a method performed in accordance with some embodiments. The method shown in FIG. 10 results in the formation of landing pads at operation 1014. The thickness of each of the landing pads provides ongoing protection against punch-through of interconnects through wordlines that are also formed with the landing pads at operation 1014. In some embodiments, operations 1002 and 1004 may be the same as, or similar to, operations 182 and 184 presented earlier in FIG. 1B, respectively. In operation 1006, a staircase pattern is formed on the substrate. Operation 1006 may be the same as or similar to operation 186 of FIG. 1B as described above.

In operation 1008, prior to depositing oxide over the staircase pattern in operation 1010, SiN is selectively formed on exposed horizontal surfaces of the nitride layers, at each nitride layer, of the staircase pattern to form SiN pads. A method as described in FIG. 1A may be used. Further examples of selective formation of SiN are described below.

Figure 14:
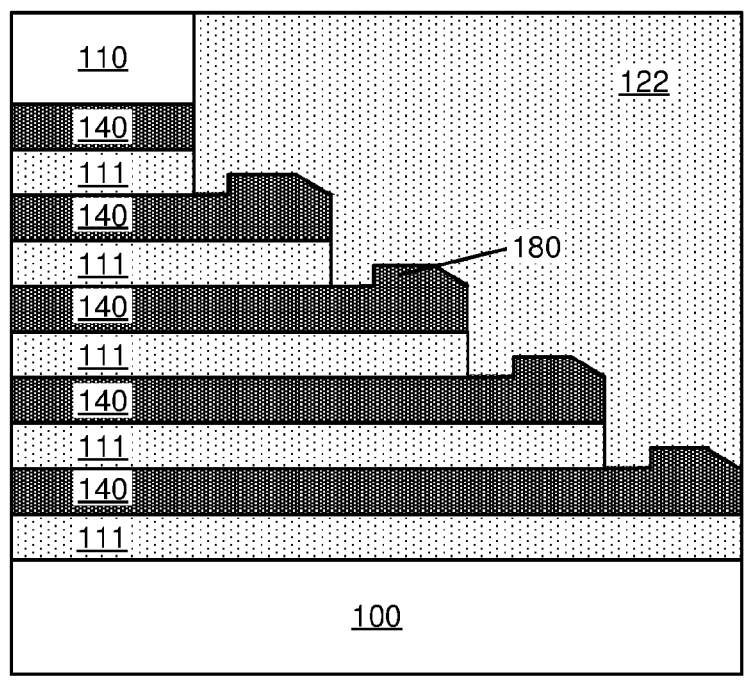

After operation 1008, oxide, also referred to as oxide filler, is deposited over the staircase pattern, including the SiN pads formed on the nitride layers at operation 1010. At operation 1012 the nitride layers with SiN pads extending from each nitride layer are selectively etched relative to the oxide layers and oxide filler to create horizontal gaps between the oxide layers in the staircase pattern, similar to that shown in FIGS. 6A and 6B. The horizontal gaps are later filled with tungsten at operation 1014 through a gap-fill operation to form tungsten wordlines and to replace the SiN pads with tungsten landing pads tungsten. The landing pads are formed on the wordlines as shown in FIG. 14, e.g., landing pads 180 formed on wordlines 140. This operation may be performed using any technique or process condition as described above with respect to operation 192 of FIG. 1B. The vacant regions created from etching the SiN pads are filled with tungsten during operation 1018 during the formation of the tungsten wordlines to form landing pads on the tungsten wordlines.

The oxide 122 is then etched to form vias in operation 1016. For example, a via is etched vertically through the oxide, e.g. similar to that shown in FIG. 8, to contact and end at a landing pad extending from a wordlines. Accordingly, multiple vias extend to each of the landing pads formed on the staircase pattern. Formation of longer vias to contact wordlines near the bottom of the staircase pattern may require a relatively longer etch duration compared to the time needed to form shorter vias to contact wordlines near the top of the staircase pattern. Accordingly, an extended etch duration to form long vias that extend to wordlines near the bottom of the staircase pattern may result in vias intended to contact wordlines at the top of the staircase pattern punching through such wordlines. The process shown in FIG. 10 protects against such punchthrough of vias through wordlines by forming a landing pads on each wordline. Each landing pad provides additional material to prevent penetration prior to punching through the wordline upon which the landing pad is formed.

At operation 1018, tungsten is deposited into the vias to form interconnects that extend through the oxide filler to contact the landing pads. In addition to providing protection against punchthrough of vias through wordlines, the landing pads also protect against punchthrough of interconnects through the wordlines as well at operation 1020.

Operation 1008 of FIG. 10 is further illustrated and described in connection with FIGS. 11-18. In some embodiments, the operation 1008 involves a PECVD process. PECVD processes are distinct from high density plasma chemical vapor deposition (HDP CVD) processes. PECVD processes use capacitively coupled plasmas (CCPs); HDP CVD processes use inductively coupled plasmas. Inductively coupled HDP CVD process conditions and resulting films are different from capacitively-coupled PECVD processes. In CCP processes, the plasma is ignited between two electrodes. In ICP processes, the RF is applied at one end of a coil with the other end held at ground. Current flowing through the coil helps generate a plasma. Example frequencies for am HDP reactors are a plasma frequency of 400 kHz for coils and a frequency of 13.56 MHz for the pedestal where the wafer is placed. In a PECVD process, example frequencies may be up to 100 MHz, e.g., 13.56 MHz or 27 MHz, as applied to the either a showerhead or the pedestal electrodes. A low frequency RF (e.g., 400 kHz) may be applied to the other of the showerhead or the pedestal electrodes. In some implementations, RF power is pulsed in PECVD processes to improve step coverage.

The generated plasmas are different, with ion densities and ion energy distribution being the key differences. For example, HDP reactors have a plasma density greater than $10^{11}$ ions/cm$^3$, higher than PECVD reactors. HDP typically have tighter ion energy distributions.

In a capacitively-coupled plasma reactor, a plasma frequency of 13.56 MHz is used to generate plasma as applied to. Ion energies in HDP reactors may be greater than in PECVD reactors. As a result, film composition and characteristics of films deposited in HDP CVD reactors are different than those deposited in PECVD reactors.

Figure 11:
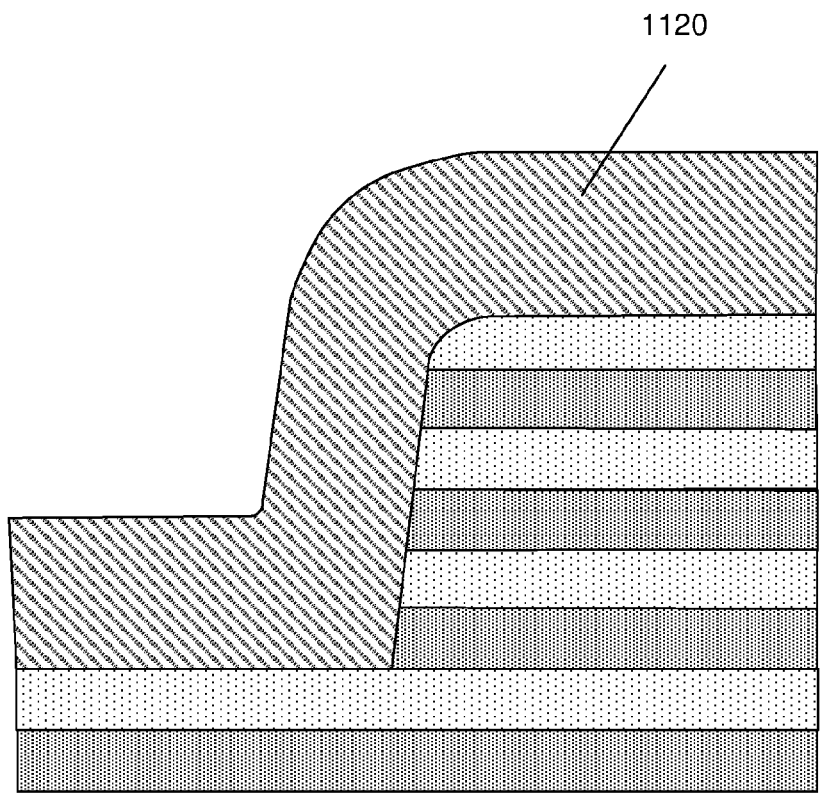
FIGS. 11-15 are schematic illustrations of a substrate in a patterning scheme.
Figure 12:
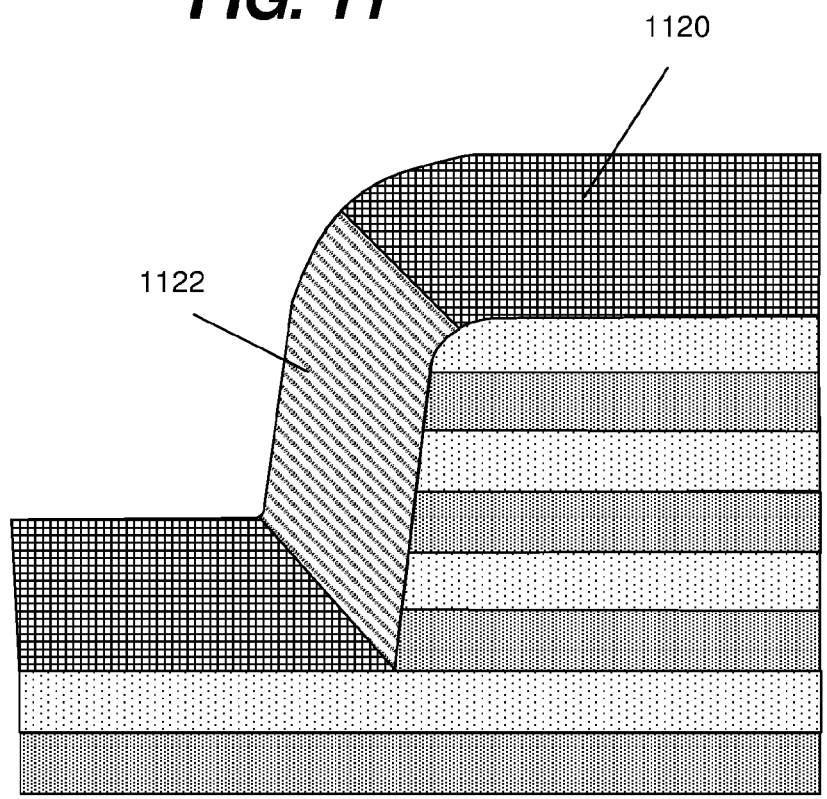

As discussed with respect to operation 1008 in FIG. 10, SiN to be deposited to form SiN pads on exposed horizontal nitride surfaces may be formed by flowing a silicon-containing precursor and a nitrogen source into a PECVD chamber. FIG. 11 shows an example of a conformal SiN layer 1120 deposited over a staircase structure. In the example of FIG. 11, the staircase structure includes multiple pairs of oxide/nitride layers. The method may also be applied to staircase structures including single pair steps. FIG. 12 shows the conformal SiN layer 1120 after treatment with sidewall SiN 1122 having a higher WER than the SiN horizontal surfaces.

The SiN layer is conformal in that it deposits on both the horizonal and vertical surfaces of the structure. High step coverage (e.g., the ratio of the sidewall thickness to the horizontal thickness) can facilitate good separation of the pad from the sidewall in the subsequent etch. In some embodiments, a sidewall to horizontal thickness ratio (either as an average over the structure or a particular stair) is at least 0.7 (70% step coverage) or 0.8 (80% step coverage). If an ALD process is used, step coverage can be close or at 100%. For the PECVD processes described herein, step coverage of at least 70%-90% may be achieved.

Figure 13:
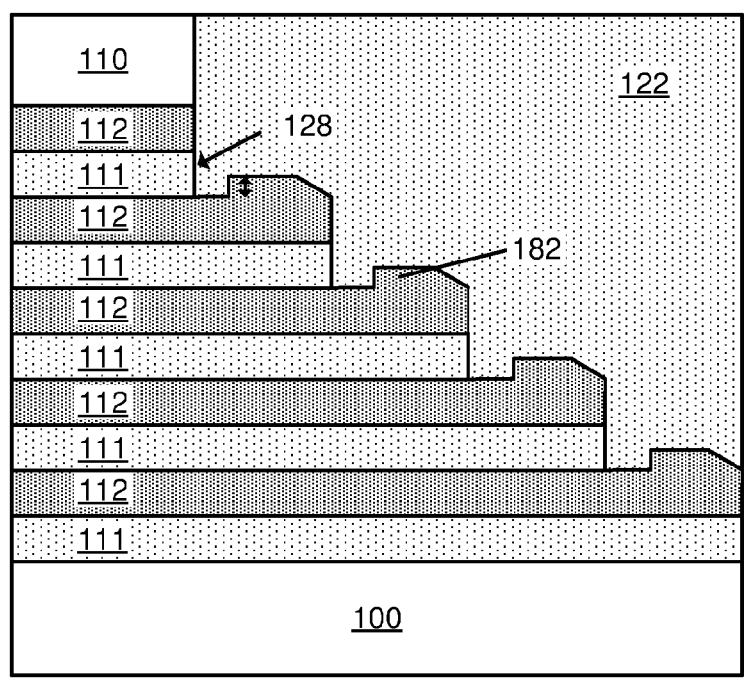

FIG. 13 shows SiN pads 182 extending from each nitride layer 112. Each SiN pad 182 is spaced apart from the oxide sidewall surface 128 such that each pad SiN forms a notch on the end of its nitride layer 112.

Next, referring to FIGS. 14, the nitride layers 112 and the SiN pads 182 deposited thereon, respectively, are etched relative to oxide on the substrate. Etching is conducted substantially as described for operation 190, as shown in FIG. 1B, to remove nitride layers 112 by flowing etchant species vertically through a slit in the ONON stack such that etchant species flow into the vertical slit and selectively etches nitride. Nitride may be selectively etched using a wet etch process, such as by exposing the substrate to phosphoric acid ($H_3PO_4$), or diluted hydrofluoric acid ("DHF"), or a mixture of these solutions. For example, FIG. 6A shows an example schematic illustration of a substrate 100 with horizontal gaps 132 formed from etching nitride.

Figure 15:
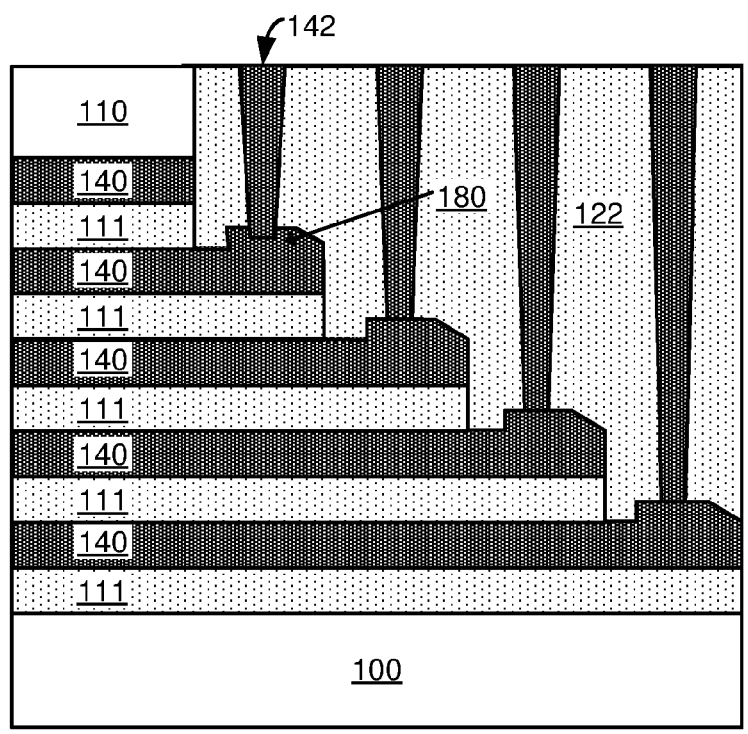

Following the selective etching of nitride found in nitride layers 112 and SiN pads 182, tungsten is deposited into the gaps of the substrate to form tungsten wordlines 140 and landing pads 180, respectively, as shown in FIG. 14. Horizontal gaps, similar to gaps 132 shown in FIG. 6A, are filled with tungsten to form tungsten wordlines. Similarly, voids resultant from etch of the SiN pads 182 are filled with tungsten to form landing pads 180. Similar to that generally shown and discussed with reference to FIGS. 8 and 9, oxide 122 is vertically etched to form vias, later filled with tungsten to form interconnects 142, as shown in FIG. 15. As described for operation 194 for FIG. 1B, oxide 122 may be etched by dry etching conducted by exposure to any one or more of the following gases: $O_2$, Ar, $C_4F_6$, $C_4F_8$, $SF_6$, $CHF_3$, and $CF_4$.

Formation of the landing pads 182, as described above and shown in FIG. 14, protects against punchthrough that is shown in FIG. 9. The depth of each landing pad 182 on each wordline 140 provides additional tungsten through which an interconnect 142 must penetrate prior to punching through to below wordlines 140, as shown in FIG. 15. Accordingly, the possibility of a punchthrough condition is greatly minimized with usage of landing pads 182. Accordingly, the overall structural integrity of the ONON stack is preserved.

Figure 16:
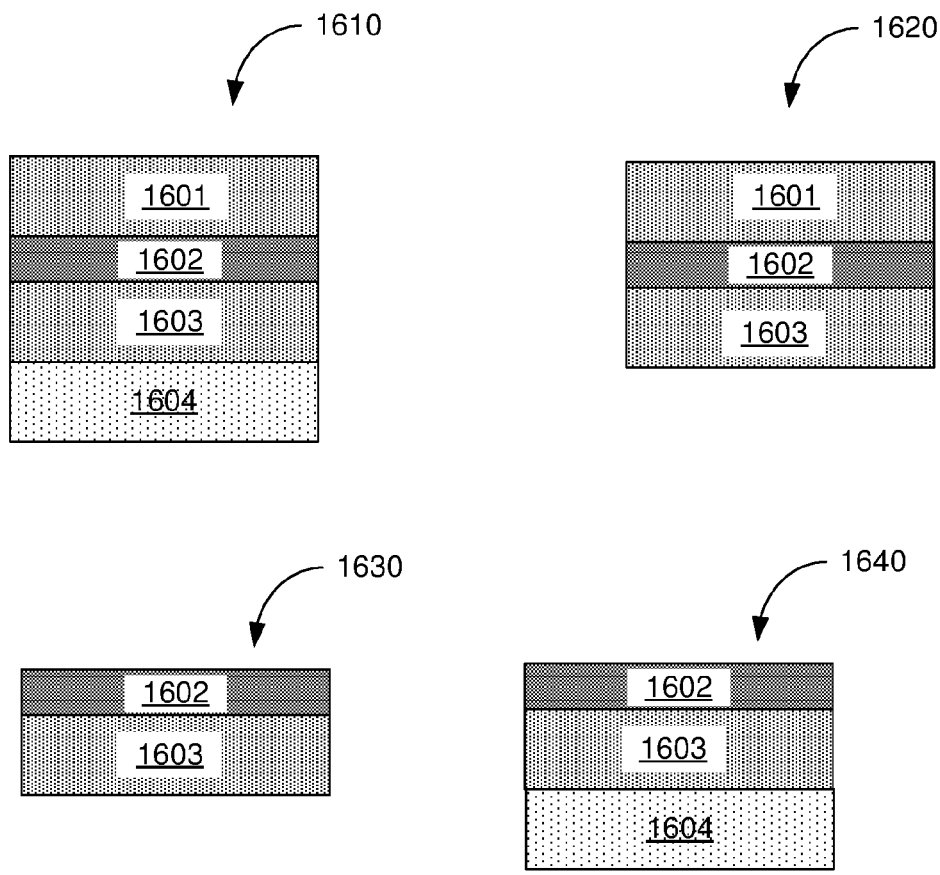
FIG. 16 illustrates examples of various silicon nitride (SiN) stacks including sub-layers having different wet etch rates (WERs).

In some embodiments, the SiN layers may include two or more sub-layers. One of the sub-layers may have very low WER (e.g., no more than 30 Å/min) and be referred to as an etch stop (ES) layer. Another sub-layer may have a higher etch rate (e.g. greater than 70 Å/min, greater than 100 Å/min, or greater than 120 Å/min) for fast sidewall removal and separation. FIG. 16 includes examples of different stacks of sub-layers. At 1610, a stack including sub-layers 1601, 1602, 1603, and 1604 is shown. Sub-layer 1602 is an ES layer, which has a lower WER than the sub-layers 1601, 1603, and 1604. At 1620, the stack includes layers 1601, 1602, and 1603, with sub-layer 1602 being the ES layer. In some embodiments, the ES layer is the top-most layer as shown at 1630 and 1640, with sub-layer 1601 being the ES layer. The ES layer could be the bottom layer, though it can be advantageous to have non-ES layers make up the bulk of the remaining SiN thickness as they are faster to form.

The ES layer may represent a small amount of the overall thickness of the deposition SiN layer. For example, for about 600 Å deposited, it may be only 40 Å. Using such a sub-layer can allow higher WERs to be used for the other layers in the stack, allowing fast sidewall removal and separation from the sidewall.

In FIG. 16, any two of the sub-layers 1601, 1602, 1603, and 1604 may have the same or different WER. Each sub-layer may also be characterized by its refractive index (RI) at 633 nm. Different WERs and/or RIs may be achieved by varying the treatment operation appropriately. Lower WERs can be achieved with one or more of longer treatment times and, for CCP treatment, the addition of low frequency (LF) power to generate the treatment plasma. Chamber pressure during treatment may also be lowered to lower WER. Deposition conditions may also be used to achieve a particular WER. For example, during PECVD deposition of SiN from $SiH_4$ and $NH_3$, lowering temperature and lowering a $N_2$ carrier gas flow can increase WER.

Thus, in one example, the stack shown at 1610 may be:

Sub-layer 1604—WER greater than 145 Å/min;
Sub-layers 1603 and 1601—WER greater than 120 Å/min;
Sub-layer 1602 (ES)—WER less than 40 Å/min In some embodiments, one or more of the sub-layers may be deposited without post-treatment for high WER.

Figure 17:
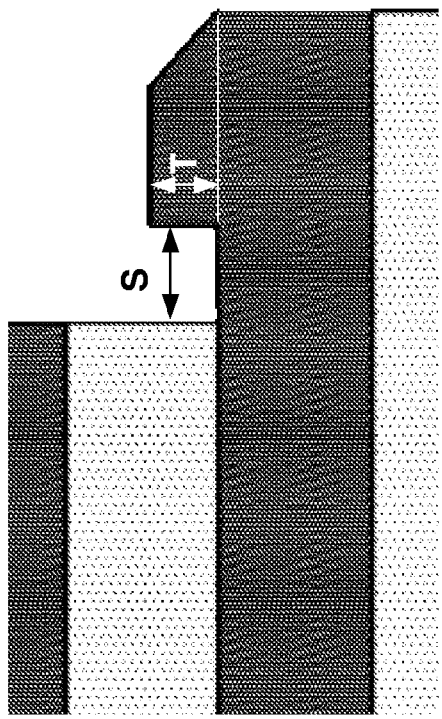
FIG. 17 illustrates target separation (S) and thickness (T) of a SiN pad according to certain embodiments.

Differential etch rates may also be achieved by varying gas composition, RF frequency, showerhead-pedestal gap, and temperature. As with the total thickness (prior to etch), the WER of the SiN layer, or if applicable each sub-layer, can depend on the following targets: 1) a remaining SiN thickness on the horizontal surfaces after wet etch (which determines tungsten landing pad thickness), 2) the minimum distance of SiN from the sidewalls of the staircase structure, and 3) lack of over-etch to achieve (1) and (2). FIG. 17 shows an example of a SiN pad after deposition and treatment. The separation (S) and thickness (T) are labeled. In some embodiments, S may range from 10 nm-60 nm, and T may range from 10-40 nm. These may be achieved without over-etch, i.e., without etching SiN away from the top of the structure.

Figure 18:
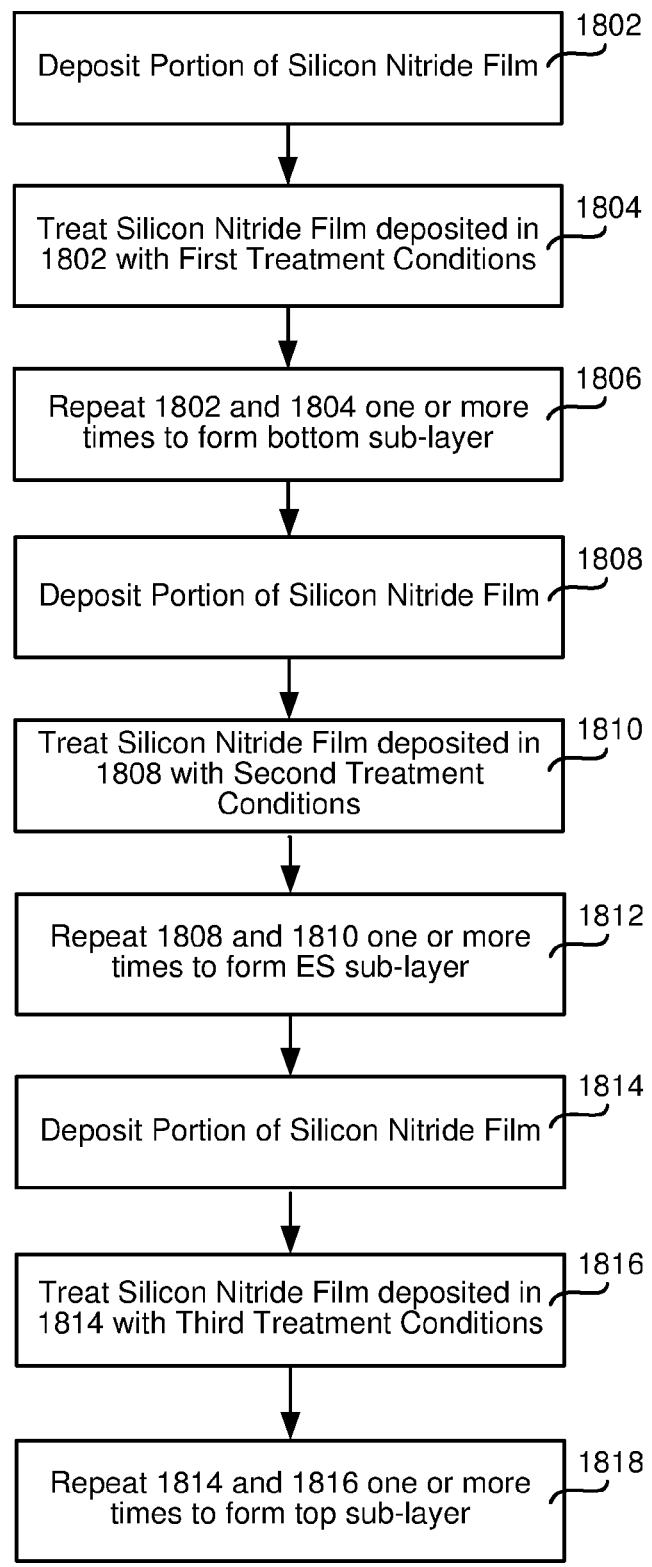
FIG. 18 is a process flow diagram depicting operations for a method according to certain embodiments.

FIG. 18 shows an example of forming a SiN layer having a tri-layer structure including an ES layer sandwiched between two higher WER layers as shown at 1620. One having ordinary skill in the art will understand how to modify the example of FIG. 18 to form other SiN layers. The method begins at 1802 by depositing a first portion of silicon nitride film. The first portion is generally thin enough such that it does not exceed the penetration depth of the subsequent treatment. Example thicknesses can range from 10 Å-50 Å, though it will be understood that the thickness depends on the particular treatment. As indicated above, deposition conditions can be varied to achieve particular WERs. Deposition conditions include substrate temperature, chamber pressure, reactant and carrier gas composition and flowrates, HF/LF power. For PECVD, example temperatures can range from 100° C.-600° C.; example pressures can range from 5 Torr-20 Torr (relatively high for PECVD); example deposition chemistries are $SiH_4$ and $NH_3$ with Ar, $N_2$, and/or He carrier gases.

The film deposited is then treated at 1804 with first treatment conditions. For CCP plasma treatment, treatment conditions can include treatment time, chamber pressure HF/LF power, and treatment gas composition and flow rates. Example treatment times can range from 1-30 second, e.g, 5-20 seconds; example pressures can range from 1-20 torr, e.g, 3-10 Torr; example HF power can range from 500 W-1500 W; example LF power can be 0 in some cases or up 500 W; example treatment gases include Ar and He, with flow rates ranging from 1000-10000 sccm each. It will be understood that the deposition and treatment conditions can fall outside the ranges described above. In some embodiments, there may be no post-deposition treatment time for this layer.

In certain embodiments, operation 1804 may be performed without LF power to achieve a relatively high WER. This can facilitate the eventual etch of the SiN pad. Example treatment times may be 5-10 seconds, inclusive of the endpoint of the range. Operations 1802 and 1804 are repeated multiple times to form a bottom sub-layer. In an example, they may be repeated to deposit a sub-layer having between 100 Å-400 Å. If the amount deposited in operation 1802 is 20 Å, this can be from 5-20 times.

Next, in an operation 1808, a portion of silicon nitride film is deposited. Deposition conditions may be as described above with respect to operation 1802. This portion is then treated at 1810 with second treatment conditions. The second treatment conditions are different from the first treatment conditions in that the values of one or more conditions are varied to change the WER. In this example, the operations 1808 and 1810 are forming part of the ES layer and to decrease the WER. In some embodiment, this involves one or both of adding (or raising) LF power and increasing treatment time. Treatment gas flowrates may be lowered and/or pressure may be lowered as well. Example treatment times may be from 15-25 seconds, inclusive. Operations 1808 and 1810 are repeated one or more times in operation 1812 to form a ES sub-layer. In an example, they may be repeated to deposit a sub-layer having between 20 Å-60 Å. Note that in this example, the ES layer is significantly thinner than the bottom sub-layer. In the full thickness is deposited in operation 1808, operation 1812 is omitted.

A portion of silicon nitride film is then deposited at 1814. Deposition conditions may be as described above with respect to operation 1802. This portion is then treated at 1816 with third treatment conditions. The third treatment conditions are different from the second treatment conditions in that the values of one or more conditions are varied to change the WER, but may be the same or different as the first treatment conditions. In some embodiments, the WER is relatively high to result in fast removal and separation from the sidewall. Example treatment times can range from 1-30 second, e.g, 5-20 seconds; example pressures can range from 1-20 torr, e.g, 3-10 Torr; example HF power can range from 500 W-1500 W; example LF power can be 0 in some cases or up 500 W; example treatment gases include Ar and He, with flowrates ranging from 1000-10000 sccm each. Operations 1816 and 1818 are repeated multiple times to form a top sub-layer. In an example, they may be repeated to deposit a sub-layer having between 100 Å-400Å.

In some embodiments, one or more of the sub-layers that are not ES layers may be deposited without a post deposition treatment. In such cases, the sub-layer deposition may be performed in one step without cycling between deposition and treatment.

In some embodiments, the thickness of the one or more sub-layers under the ES layer is or near the target thickness. For example, for a target thickness of 20 nm, layer 1603 (at 1620 and 1630) or layers 1603 and 1604 (at 1610) may total 20 nm thickness or close to 20 nm.

EXAMPLES

PECVD deposition conditions were varied to vary the WER in 100:1 DHF. Post-deposition treatments were held constant (10 seconds, 5.5 Torr, HF/LF 1000/0 watt, 10000 sccm Ar/4000 sccm He). For both deposition processes A and B, the chamber pressure was 9 Torr, HF/LF 575/0 watt with $SiH_4$ and $NH_3$ process gasses.

Process A used 550° C. substrate temperature and 10000 sccm Ar/6000 sccm $N_2$ carrier gas. Process B used 510° C. substrate temperature and 10000 sccm Ar/3000 sccm $N_2$/3000 sccm He carrier gas. (3000 sccm He added to keep same total flow as Process A). WER for Process A was 90 Å/min. WER for Process B was 141 Å/min.

The Process B PECVD deposition was used to form an ES layer. Treatment time was increased to 20 seconds (two 10 and pressure was lowered to 4 Torr. HF/LF power was 800/300 watt (adding LF power). Gas flow rates were lowered 3000 sccm Ar/2000 sccm He. WER was 25 Å/min.

Figure 19:
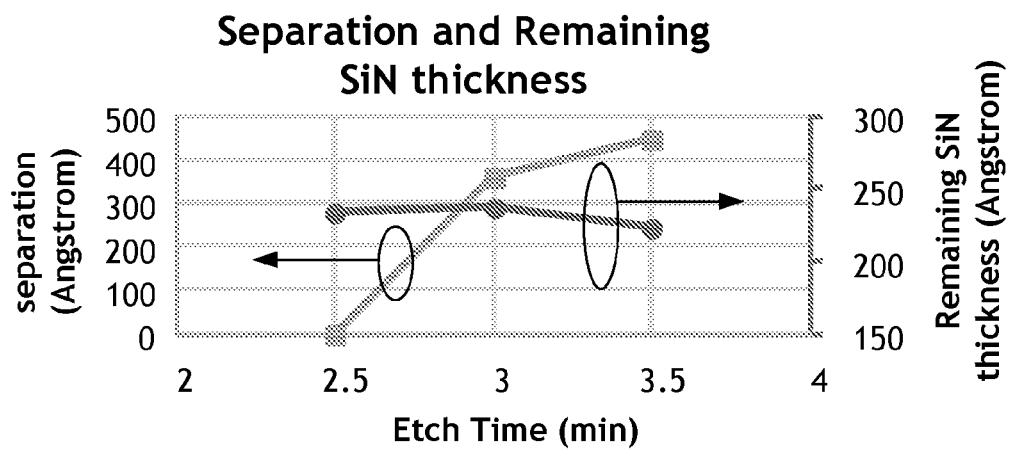
FIG. 19 is graph showing separation and remaining thickness vs etch time for SiN pads formed according to certain embodiments.

FIG. 19 shows separation and remaining thickness vs etch time for a SiN stack that included an 20-40 Å ES layer as described above sandwiched between layers formed as described for Process B. The results indicate that the ES layer holds the remaining thickness, with fast separation generated.

Apparatus

A suitable apparatus for performing the disclosed methods typically includes hardware for accomplishing the process operations and a system controller having instructions for controlling process operations in accordance with the methods described above.

Figure 20:
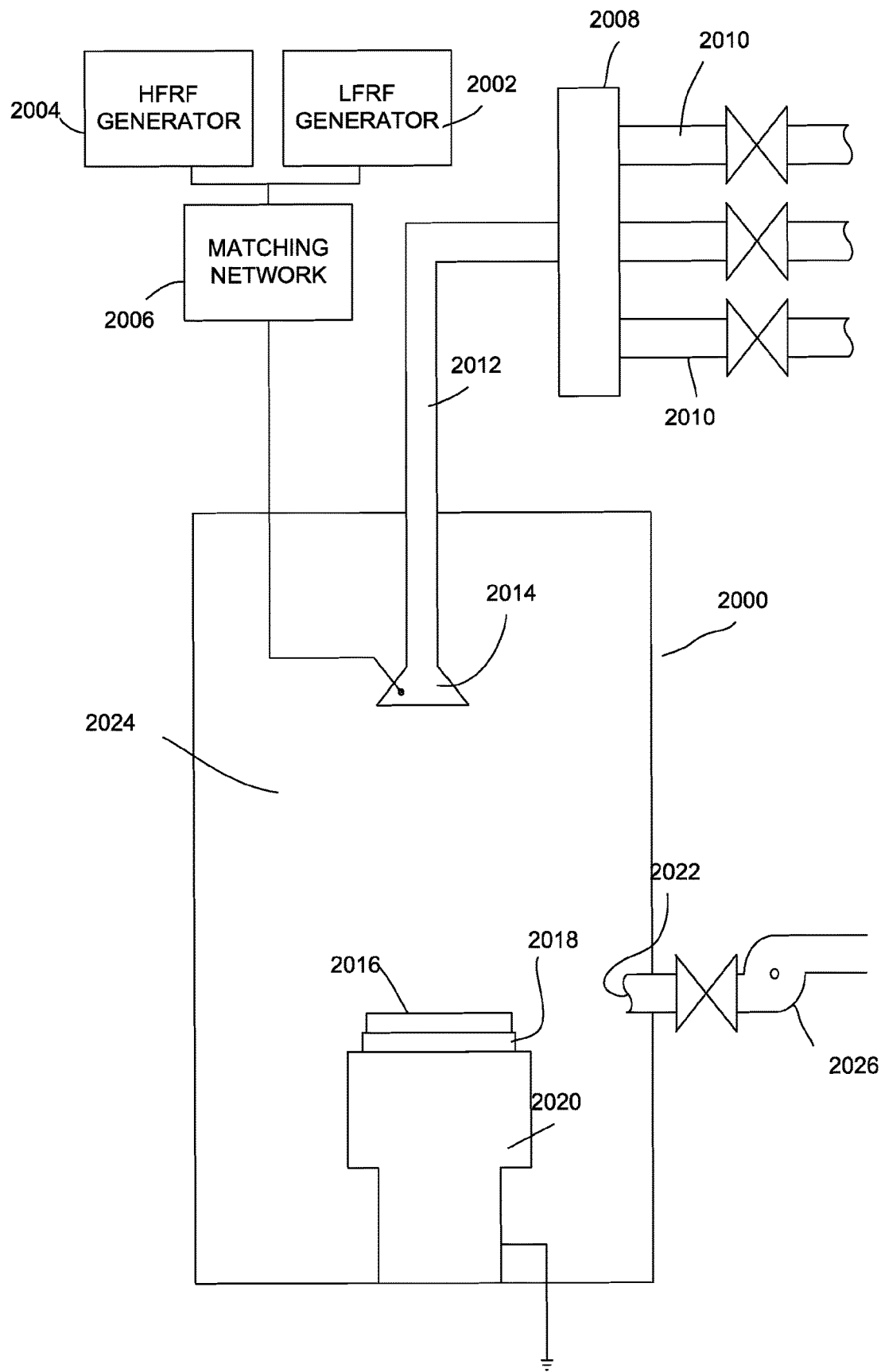
FIG. 20 is a schematic diagram of an example process chamber for performing certain disclosed embodiments.

FIG. 20 provides a block diagram of an example apparatus that may be used to practice the disclosed embodiments. As shown, a reactor 2000 includes a process chamber 2024, which encloses other components of the reactor and serves to contain the plasma generated by, e.g., a capacitor type system including a showerhead 2014 working in conjunction with a grounded heater block 2020. A high-frequency RF generator 2002, connected to a matching network 2006, and a low-frequency RF generator 2004 are connected to showerhead 2014. The power and frequency supplied by matching network 2006 is sufficient to generate a plasma from the process gas, for example 400-700W total energy. In one implementation both the HFRF generator and the LFRF generator are used to treat an ES layer with the HFRF generator only used for PECVD deposition and treatment of the other layers. In a typical process, the high frequency RF component is generally between about 2-60 MHz; and in particular embodiments, the HF component is about 13.56 MHz or 27 MHz. The low frequency LF component is generally between about 250-400 kHz; in a particular embodiment, the LF component is about 350 kHz.

Within the reactor, a pedestal 2018 supports a substrate 2016. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 2012. Multiple source gas lines 2010 are connected to manifold 2008. The gases may be premixed or not. Appropriate valving and mass flow control mechanisms are employed to ensure that the correct gases are delivered during the deposition and plasma treatment phases of the process. In the case that the chemical precursor(s) are delivered in liquid form, liquid flow control mechanisms are employed. The liquid is then vaporized and mixed with other process gases during its transportation in a manifold heated above its vaporization point before reaching the deposition chamber.

Process gases exit chamber 2000 via an outlet 2022. A vacuum pump 2026 (e.g., a one or two stage mechanical dry pump and/or a turbomolecular pump) draws process gases out and maintains a suitably low pressure within the reactor by a close loop controlled flow restriction device, such as a throttle valve or a pendulum valve.

The methods may be implemented on a multi-station or single station tool. A Vector™ tool available from Lam Research of Fremont California having a multiple stations. It is possible to index the wafers after every deposition and/or post-deposition plasma treatment until all the depositions and treatments are completed, or multiple depositions and treatments can be conducted at a single station before indexing the wafer.

Figure 21:
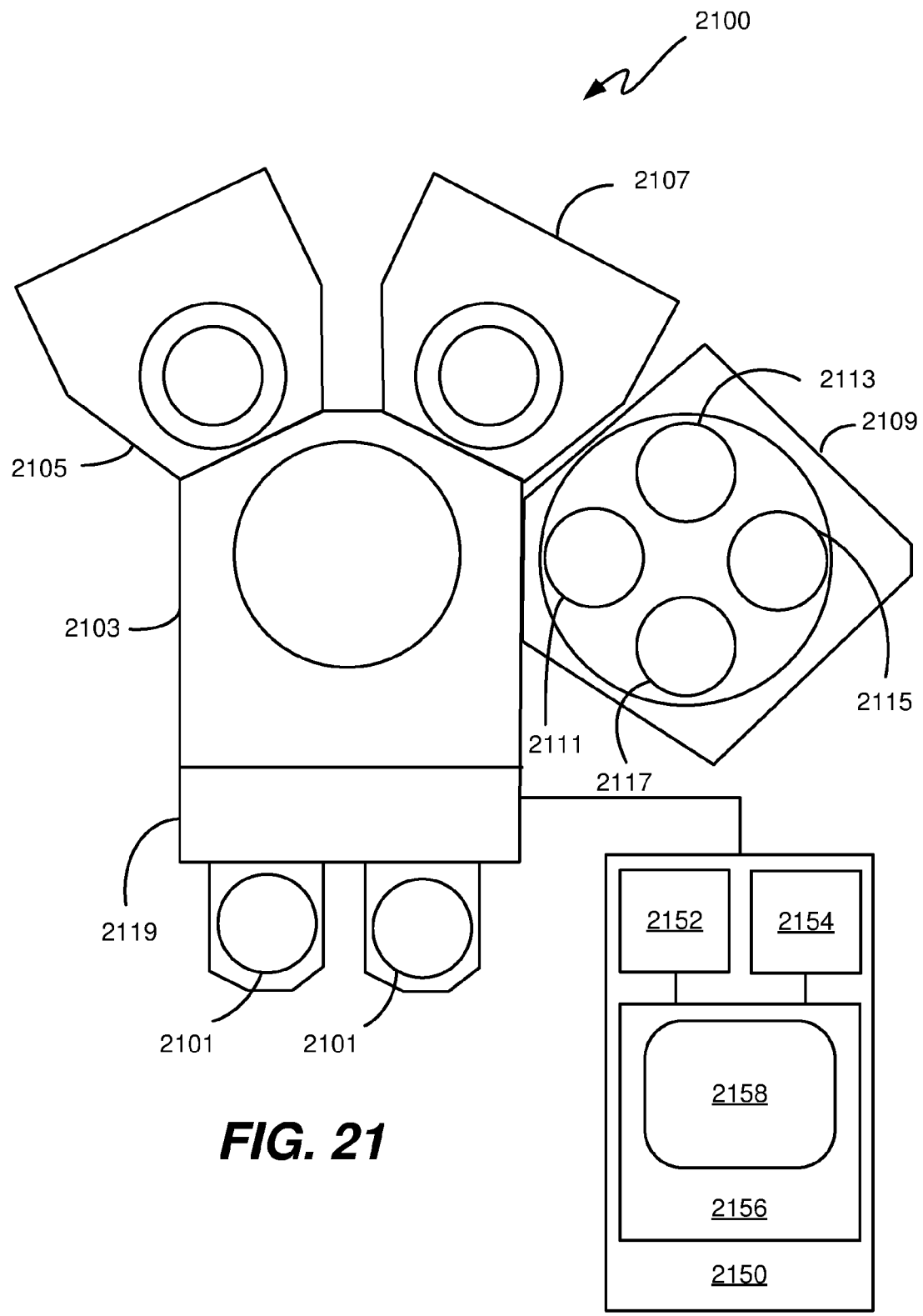
FIG. 21 is a schematic diagram of an example process tool for performing certain disclosed embodiments.

In some embodiments, reactor shown in FIG. 20 is part of a tool for processing one or more wafers. An example of a tool including one or more reactors is provided in FIG. 21. FIG. 21 is a block diagram of a processing system suitable for conducting a deposition process in accordance with disclosed embodiments. The system 2100 includes a transfer module 2103, such as the wafer transfer system (WTS) used on the Vector™ platform available from Lam Research Corporation of Fremont, California. The transfer module 2103 provides a clean, pressurized environment to minimize the risk of contamination of workpieces, such as wafers, being processed as they are moved between the various processing stages.

Mounted on the transfer module 2103 is a chamber 2109 capable of performing a PECVD process. Chamber 2109 may include multiple stations 2111, 2113, 2115, and 2117 that may sequentially perform deposition or treatment operations. The system 2100 also includes one or more (in this case two) wafer source modules 2101 where wafers are stored before and after processing. A loadlock 2119 is located between the transfer module 2103 and the wafer source modules 2101. A device (generally a robot arm unit) in the transfer module 2103 moves the wafers among the modules mounted on the transfer module 2103. Other modules 2105 and 2107 may be mounted on the transfer module. These may be deposition, etch, or treatment modules for example. FIG. 21 also depicts an embodiment of a system controller 2150 employed to control process conditions and hardware states of process tool 2100. System controller 2150 may provide program instructions for implementing the above-described processes. The program instructions may control a variety of process parameters, such as RF power levels, pressure, temperature, flow rates, etc.

In some implementations, a controller 2150 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 2150, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 2150 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

In some embodiments, system controller 2150 controls all of the activities of process tool 2100. System controller 2150 may include one or more memory devices 2156, one or more mass storage devices 2154, and one or more processors 2152. Processor 2152 may include a CPU or computer, analog and/or digital input/output connections, stepper motor controller boards, etc. System controller 2150 executes system control software 2158 stored in mass storage device 2154, loaded into memory device 2156, and executed on processor 2152. Alternatively, the control logic may be hard coded in the controller 2150. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 2158 may include instructions for controlling the transfer of wafers into and out of a process chamber, timing of gases, mixture of gases, amount of gas flow, chamber and/or station pressure, backside gas flow pressure, chamber and/or reactor temperature, wafer temperature, bias power, target power levels, RF power levels, pedestal, chuck and/or susceptor position, and other parameters of a particular process performed by process tool 2100. System control software 2158 may be configured in any suitable way. For example, various process tool component subroutines or control objects may be written to control operation of the process tool components necessary to carry out various process tool processes. System control software 2158 may be coded in any suitable computer readable programming language.

The controller 2150, in some implementations, may be a part of or coupled to a computer that is integrated with, coupled to the system, otherwise networked to the system, or a combination thereof. For example, the controller 2150 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 2150 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 2150 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, system control software 2158 may include input/output control (IOC) sequencing instructions for controlling the various parameters described above. Other computer software and/or programs stored on mass storage device 2154 and/or memory device 2156 associated with system controller 2150 may be employed in some embodiments. Examples of programs or sections of programs for this purpose include a wafer positioning program, a process gas control program, a pressure control program, a heater control program, and a plasma control program.

A wafer positioning program may include program code for process tool components that are used to load a wafer onto a pedestal and to control the spacing between the wafer and other parts of process tool 2100. A process gas control program may include code for controlling gas composition (e.g., deposition gases, treatment gases, carrier gases, etc., as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station.

A heater control program may include code for controlling the current to a heating unit that is used to heat the workpiece. Alternatively, the heater control program may control delivery of a heat transfer gas (such as helium) to the wafer. A plasma control program may include code for setting RF power levels applied to the process electrodes and, if appropriate, the bias in one or more process stations in accordance with the embodiments herein. A pressure control program may include code for maintaining the pressure in the reaction chamber in accordance with the embodiments herein.

In some embodiments, there may be a user interface associated with system controller 2150. The user interface may include a display screen, graphical software displays of the apparatus and/or process conditions, and user input devices such as pointing devices, keyboards, touch screens, microphones, etc.

In some embodiments, parameters adjusted by system controller 2150 may relate to process conditions. Non-limiting examples include process gas composition and flow rates, temperature, pressure, plasma conditions (such as RF power levels), pressure, temperature, etc. These parameters may be provided to the user in the form of a recipe, which may be entered utilizing the user interface.

Signals for monitoring the process may be provided by analog and/or digital input connections of system controller 2150 from various process tool sensors. The signals for controlling the process may be output on the analog and digital output connections of process tool 2100. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a substrate having alternating oxide layers and nitride layers arranged in a staircase pattern comprising exposed horizontal nitride surfaces and exposed oxide and nitride sidewall surfaces;
   depositing a silicon nitride (SiN) layer over the alternating oxide and nitride layers by a plasma enhanced chemical vapor deposition (PECVD) process using a plasma generated from a process gas comprising a silicon-containing precursor; and
   treating the SiN layer to selectively densify the SiN layer deposited on the exposed horizontal nitride surfaces wherein the SiN layer comprises a first sub-layer disposed between two second sub-layers each having a higher wet etch rate (WER) than the first sub-layer.

2. The method of claim 1, wherein the deposition and treating operations are performed in a same chamber.

3. The method of claim 1, wherein treating the SiN layer comprises exposing the substrate to a capacitively-coupled plasma generated.

4. The method of claim 1, wherein performing the depositing and treating operations comprises performing multiple cycles of depositing a portion of the SiN layer followed by treating the deposited portion.

5. The method of claim 1, wherein at least one of the two second sub-layers is a sub-layer having a WER of at least 100 Å/min in a wet etchant.

6. The method of claim 1, wherein the first sub-layer has a WER of no more than 50 Å/min in a wet etchant.

7. The method of claim 6, wherein the each of the two second sub-layers is thicker than the first sub-layer.

8. The method of claim 1, wherein the SiN layer is deposited from silane ($SiH_4$) and ammonia ($NH_3$).

9. The method of claim 8, wherein the $SiH_4$ and $NH_3$ are in a process gas that further comprises nitrogen ($N_2$).

10. The method of claim 1, further comprising wet etching the treated SiN layer to form discrete SiN pads.

11. The method of claim 10, wherein a discrete SiN pad is at least 10 nm from the near sidewall surface.

12. The method of claim 10, wherein a discrete SiN pad is at least 10 nm thick.

13. The method of claim 10, further comprising replacing the SiN pads with tungsten landing pads.

14. A method comprising:
    providing a substrate having alternating oxide layers and nitride layers arranged in a staircase pattern comprising exposed horizontal nitride surfaces and exposed oxide and nitride sidewall surfaces;
    depositing a silicon nitride (SiN) layer over the horizontal and sidewall surfaces by a plasma enhanced chemical vapor deposition (PECVD) process using a plasma generated from a process gas comprising a silicon-containing precursor; and
    treating the SiN layer to selectively densify the SiN layer deposited on the horizontal surfaces, wherein a chamber pressure of a chamber housing the substrate is higher during PECVD deposition of the SiN layer than during treating the SiN layer.

15. The method of claim 14, further comprising wet etching the treated layer to form discrete SiN pads.

16. The method of claim 14, wherein chamber pressure during PECVD deposition is between 5 and 20 Torr.

17. The method of claim 14, further comprising pulsing radio frequency (RF) power during the PECVD.

18. The method of claim 14, wherein step coverage of the SiN layer on the staircase pattern is between 70% and 90%.

19. A method comprising:
    providing a substrate having horizontal and sidewall surfaces;
    performing one or more first cycles to form a first sub-layer, each of the one or more first cycles comprising:
       depositing an amount of SiN on the horizontal and sidewall surfaces by plasma enhanced chemical vapor deposition (PECVD) and exposing the deposited amount of SiN to a capacitively coupled plasma generated from an inert gas;
    performing one or more second cycles to form an etch stop sub-layer, each of the one or more second cycles comprising:
       depositing an amount of SiN on the first sub-layer by PECVD and exposing the deposited amount of SiN to a capacitively coupled plasma generated from an inert gas using low frequency radio frequency (LFRF) power, wherein LFRF power applied during formation of the etch stop sub-layer is higher than LFRF power, if any, applied during formation of the first sub-layer.

20. The method of claim 19, wherein the LFRF power in the one or more second cycles is greater than the LFRF power, if any, in the one or more first cycles.

* * * * *